(12) United States Patent
Tsuji et al.

(10) Patent No.: US 8,212,258 B2
(45) Date of Patent: Jul. 3, 2012

(54) DISPLAY DEVICE AND METHOD FOR MANUFACTURING DISPLAY DEVICE

(75) Inventors: Akiko Tsuji, Kanagawa (JP); Toshiki Matsumoto, Kanagawa (JP); Hirofumi Fujioka, Aichi (JP); Mitsuru Asano, Aichi (JP); Hiroshi Sagawa, Kanagawa (JP); Kiwamu Miura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/899,981

(22) Filed: Oct. 7, 2010

(65) Prior Publication Data
US 2011/0095299 A1 Apr. 28, 2011

(30) Foreign Application Priority Data
Oct. 22, 2009 (JP) ................................ P2009-243589

(51) Int. Cl.
*H01L 33/16* (2010.01)
(52) U.S. Cl. ............... 257/72; 257/98; 257/40; 257/103; 257/79; 257/E33.001; 257/E33.053; 257/E33.061; 257/E21.158; 257/89; 257/E27.121; 257/E21.001
(58) Field of Classification Search ............ 257/72, 257/98, 40, 89, 103, 79, E33.001, E33.053, 257/E33.061, E21.158, E27.121, E21.001
See application file for complete search history.

(56) References Cited

U.S. PATENT DOCUMENTS

2008/0224607 A1* 9/2008 Matsuo et al. ............... 313/505
2009/0256168 A1* 10/2009 Taneda et al. ................. 257/98

FOREIGN PATENT DOCUMENTS

| JP | 2001-160486 | 6/2001 |
|---|---|---|
| JP | 2002-116715 | 4/2002 |
| JP | 2004-207217 | 7/2004 |
| JP | 2005-266667 | 9/2005 |
| JP | 2006-54111 | 1/2006 |
| JP | 2007-148540 | 12/2007 |

* cited by examiner

*Primary Examiner* — Marc Armand
(74) *Attorney, Agent, or Firm* — K&L Gates LLP

(57) ABSTRACT

Disclosed herein is a display device, including: a substrate; a circuit part configured to include a drive element formed over the substrate; a planarization insulating layer configured to be formed on the circuit part; an electrically-conductive layer configured to be formed on the planarization insulating layer and include a plurality of first electrodes and an auxiliary interconnect; an aperture-defining insulating layer configured to insulate the plurality of first electrodes from each other and have an aperture through which part of the first electrode is exposed; a plurality of light emitting elements configured to be formed by stacking the first electrode, an organic layer including a light emitting layer, and a second electrode in that order; and a separator configured to be formed by removing the planarization insulating layer at a position surrounding a display area in which the plurality of light emitting elements connected to the drive element are disposed.

4 Claims, 25 Drawing Sheets

DISPLAY DEVICE AND METHOD FOR MANUFACTURING DISPLAY DEVICE

CROSS REFERENCES TO RELATED APPLICATIONS

The present application claims priority to Japanese Priority Patent Application JP 2009-243589 filed with the Japan Patent Office on Oct. 22, 2009, the entire content of which is hereby incorporated by reference.

BACKGROUND

This application relates to a display device and a method for manufacturing a display device. More specifically, the application relates to a method for manufacturing a self-luminous display device employing an organic electro luminescence (EL) element.

In recent years, the organic EL display employing the organic EL element is attracting attention as a display device to replace the liquid crystal display. The organic EL display is a self-luminous display in which an organic material itself emits light in response to current application to the material. The organic EL display has the following excellent features: no necessity for a backlight, excellent color reproducibility, high contrast, responsiveness suitable for a moving image, a wide viewing angle, etc.

Meanwhile, the organic EL display involves the deterioration of the organic layer of the organic EL element due to moisture absorption, and thus has e.g. problems that the emission luminance of the organic EL element is lowered and that the light emission becomes unstable.

For the organic EL display, there has been proposed an active-matrix system in which a thin film transistor (TFT) is disposed as a switching element for each pixel and the organic EL element included in the pixel is controlled.

In the organic EL display of this active-matrix system, an organic insulating film having a flat surface is formed as a layer located above the TFT, and plural organic EL elements are formed into a matrix on the flat surface of this organic insulating film. This organic insulating film has water-permeable nature. If water is diffused into a display area P in which the organic EL elements are disposed due to this organic insulating film, the organic EL elements are deteriorated and problems of displaying failure and so forth occur.

Various techniques to prevent the diffusion of water into the display area P have been proposed. For example, Japanese Patent Laid-open No. 2006-054111 (hereinafter, Patent Document 1) proposes a technique of providing a separator surrounding the display area. In this technique, by the separator, water remaining in the peripheral area can be prevented from entering the display area. For example, Japanese Patent Laid-open No. 2005-266667 (hereinafter, Patent Document 2) proposes a technique of providing pores reaching the first insulating film in the lower electrode disposed in the peripheral area to thereby discharge water and so forth included in the first insulating film.

In an organic EL display having a top-emission structure, in which light is extracted from the sealing panel side, the electrode of the light-extraction side (upper electrode) is an electrode common to the respective organic EL elements and is formed by using an optically-transmissive, electrically-conductive material such as indium tin oxide (ITO).

However, the resistivity of such an optically-transmissive, electrically-conductive material is higher by about two or three orders of magnitude than that of a normal metal material. Thus, the voltage applied to the upper electrode is uneven in the plane, which leads to a problem that variation in the emission luminance from position to position arises among the respective organic EL elements and the displaying quality is lowered.

To address this problem, e.g. Japanese Patent Laid-open No. 2004-207217 (hereinafter, Patent Document 3) proposes a technique of forming a power supply auxiliary interconnect for being connected to the cathode electrode in the same layer as that of the anode electrode. In this technique, the power supply auxiliary interconnect in the same layer as that of the first electrode is connected outside the display area, and the cathode electrode and the power supply auxiliary interconnect are connected also in the display area. Thereby, the cathode voltage is stabilized.

In the technique of Patent Document 3, an AlNd alloy is used as the anode electrode material in order to ensure high reflectance of the anode electrode, whereas an optically-transmissive MgAg alloy is used for the cathode electrode. However, a natural oxide film is easily generated on the surface of the AlNd alloy. This increases the contact resistance between the cathode electrode and the power supply auxiliary interconnect, which is composed of the same material as that of the anode electrode, and thus causes a problem that the connection between the cathode electrode and the power supply auxiliary interconnect becomes electrically unstable.

To address this problem, e.g. PCT Patent Publication No. WO2007/148540 brochure (hereinafter, Patent Document 4) proposes a technique in which the cathode electrode is brought into contact with a Ti/Al/Ti multilayer film as the second metal layer forming the signal line and the power supply line of the circuit formed by using a TFT and the cathode electrode is connected to an AlNd alloy as the auxiliary interconnect via Ti.

Specifically, in this technique, as shown in FIG. 28, a contact pad 225 formed of the Ti/Al/Ti multilayer film is electrically connected to an auxiliary interconnect 214 composed of the AlNd alloy. Furthermore, a cathode electrode 218 composed of an MgAg alloy is electrically connected to the contact pad 225. Thereby, the auxiliary interconnect 214 and the cathode electrode 218 are electrically connected to each other via the contact pad 225.

To form this connection structure, an aperture for leading the auxiliary interconnect 214 to a lower layer is formed in a planarization insulating film 213. In an aperture-defining insulating film 216, an aperture for leading the cathode electrode 218 to a lower layer is formed. Furthermore, in order to prevent the cathode electrode 218 formed along the inner wall surface of this aperture from being broken due to steps, the size of the aperture by the aperture-defining insulating film 216 is set larger than the size of the aperture by the planarization insulating film 213. Thus, the flat surface of the planarization insulating film 213 partially has an exposed surface that is not covered by the aperture-defining insulating film 216. The cathode electrode 218 is formed along this exposed surface and the inner wall surface of the aperture by the planarization insulating film 213.

As the material of the aperture-defining insulating film 216 and the planarization insulating film 213, a photosensitive resin such as polybenzoxazole or polyimide is used as described in Japanese Patent Laid-open No. 2002-116715 (hereinafter, Patent Document 5) and Japanese Patent Laid-open No. 2001-160486 (hereinafter, Patent Document 6) for example. After this photosensitive resin is applied, the aperture-forming part is exposed and the exposed part is removed by a removing liquid. Thereby, the aperture by the aperture-defining insulating film 216 and the aperture by the planarization insulating film 213 are formed.

SUMMARY

However, in the technique described in Patent Document 1, water remains not only in the organic insulating film in the peripheral area but also in the organic insulating film in the display area. Therefore, only preventing water remaining in the organic insulating film in the peripheral area from entering the display area is not sufficient. Consequently, the technique described in Patent Document 1 involves a problem that dark spots, the transformation of the cathode electrode, and so forth occur attributed to the water remaining in the organic insulating film in the display area and long-term reliability can not be obtained.

The technique described in Patent Document 2 is effective if baking treatment is performed. However, in this technique, water in the peripheral area can not be sufficiently removed and long-term reliability can not be obtained.

The technique described in Patent Document 4 has a structure in which the inner wall surface of the aperture by the planarization insulating film 213 and the exposed surface of the flat surface by the planarization insulating film 213 are in direct contact with the cathode electrode 218. Therefore, due to the permeation of water remaining in the planarization insulating film 213 into the cathode electrode 218 and degassing from the planarization insulating film 213, the cathode electrode 218 is deteriorated, and as a result the displaying characteristics are lowered.

Furthermore, in the technique described in Patent Document 4, when the exposed part of the photosensitive resin is removed in the forming of the aperture of the aperture-defining insulating film 216, the inner wall surface of the aperture by the planarization insulating film 213 at the position corresponding to this removed part suffers from a damage, so that recess and projection are generated in the inner wall surface of the aperture by the planarization insulating film 213.

In the technique described in Patent Document 4, the cathode electrode 218 is formed along the inner wall surface in which the recess and projection are generated. Thus, the cathode electrode 218 will be possibly disconnected due to the influence of the recess and projection. If the cathode electrode 218 is disconnected, voltage drops occur in several pixels around this disconnected part and the voltage drops are visually recognized as shading.

There is a need for this application to provide a display device and a method for manufacturing a display device each allowing suppression of the deterioration of the displaying characteristics due to the diffusion of water remaining in an organic insulating film and degassing from the planarization insulating film.

There is another need for this application to provide a display device and a method for manufacturing a display device each allowing suppression of the deterioration of the displaying characteristics by suppressing the disconnection of the electrode.

According to a first embodiment, there is provided a display device including a substrate, a circuit part configured to include a drive element formed over the substrate, and a planarization insulating layer configured to be formed on the circuit part. The display device further includes an electrically-conductive layer configured to be formed on the planarization insulating layer and include a plurality of first electrodes and an auxiliary interconnect, and an aperture-defining insulating layer configured to insulate the plurality of first electrodes from each other and have an aperture through which part of the first electrode is exposed. The display device further includes a plurality of light emitting elements configured to be formed by stacking the first electrode, an organic layer including a light emitting layer, and a second electrode common to the plurality of light emitting elements in that order over an exposed part of each of the plurality of first electrodes, and a separator configured to be formed by removing the planarization insulating layer at a position surrounding a display area in which the plurality of light emitting elements connected to the drive element are disposed. In the display device, in the whole area inside the separator, at least any of the electrically-conductive layer and the aperture-defining insulating layer intervenes between the planarization insulating layer and the second electrode and between the planarization insulating layer and the organic layer.

Typically, it is preferable that the display device of the first embodiment have the following configuration. Specifically, the display device further includes a contact part configured to be formed of the same layer as a metal layer included in the drive element and electrically interconnect the auxiliary interconnect and the second electrode. In the planarization insulating layer, an aperture for leading the auxiliary interconnect formed on the planarization insulating layer to a lower layer is formed above the contact part. The inner wall surface of the aperture by the planarization insulating layer is covered by at least any of the auxiliary interconnect and the aperture-defining insulating layer.

According to a second embodiment, there is provided a method for manufacturing a display device. The method includes the steps of forming a circuit part including a drive element over a substrate, forming a planarization insulating layer on the circuit part, and forming a separator in an area outside a display area in which a plurality of light emitting elements connected to the drive element are formed by removing the planarization insulating layer at a position surrounding the display area. The method further includes the steps of forming an electrically-conductive layer including a plurality of first electrodes and an auxiliary interconnect on the planarization insulating layer, forming an aperture-defining insulating layer that insulates the first electrodes from each other and has an aperture through which part of the first electrode is exposed, and forming a plurality of light emitting elements by stacking the first electrode, an organic layer including a light emitting layer, and a second electrode common to the plurality of light emitting elements in that order over an exposed part of each of the plurality of first electrodes. In the method, in the forming the electrically-conductive layer, the forming the aperture-defining insulating layer, and the forming the light emitting elements, the electrically-conductive layer, the aperture-defining insulating layer, and the plurality of light emitting elements are so formed that, in the whole area inside the separator, at least any of the electrically-conductive layer and the aperture-defining insulating layer intervenes between the planarization insulating layer and the second electrode and between the planarization insulating layer and the organic layer.

Typically, it is preferable that the method of the second embodiment have the following configuration. Specifically, in the forming the circuit part, a contact part that electrically interconnects the auxiliary interconnect and the second electrode is formed by using the same layer as a metal layer included in the drive element. In the forming the planarization insulating layer, an aperture for leading the auxiliary interconnect formed on the planarization insulating layer to a lower layer is formed above the contact part. In the forming the electrically-conductive layer and the forming the aperture-defining insulating layer, the auxiliary interconnect and the aperture-defining insulating layer are so formed that the inner wall surface of the aperture by the planarization insulating layer is covered by at least any of the auxiliary interconnect and the aperture-defining insulating layer.

The first and second embodiments of this application have a configuration in which, in the whole area inside the separator, at least any of the electrically-conductive layer and the aperture-defining insulating layer intervenes between the planarization insulating layer and the second electrode and between the planarization insulating layer and the organic layer. This configuration can suppress the deterioration of the displaying characteristics due to the diffusion of water remaining in the planarization insulating layer and degassing from the planarization insulating layer.

Typically, in the first and second embodiments, the following configuration is employed. Specifically, the contact part that is formed of the same layer as the metal layer included in the drive element and electrically interconnects the auxiliary interconnect and the second electrode is provided. In the planarization insulating layer, the aperture for leading the auxiliary interconnect formed on the planarization insulating layer to a lower layer is formed above the contact part. Furthermore, the inner wall surface of the aperture by the planarization insulating layer is covered by at least any of the auxiliary interconnect and the aperture-defining insulating layer. This configuration can suppress the disconnection of the electrode and suppress the deterioration of the displaying characteristics.

The embodiments of this application can suppress the deterioration of the displaying characteristics due to the diffusion of water remaining in the planarization insulating layer and degassing from the planarization insulating layer. Furthermore, an embodiment can suppress the disconnection of the electrode and suppress the deterioration of the displaying characteristics.

Additional features and advantages are described herein, and will be apparent from the following Detailed Description and the figures.

DETAILED DESCRIPTION

Embodiments of this application will be described below with reference to the drawings. The order of the description is as follows. In all the drawings for the embodiments, the same or corresponding part is given the same symbol or numeral.

1. First Embodiment (first example of display device)
2. Second Embodiment (second example of display device)
3. Third Embodiment (third example of display device)
4. Fourth Embodiment (fourth example of display device)
5. Other Embodiments (modification examples)

1. First Embodiment

Configuration of Display Device

Figure 1:
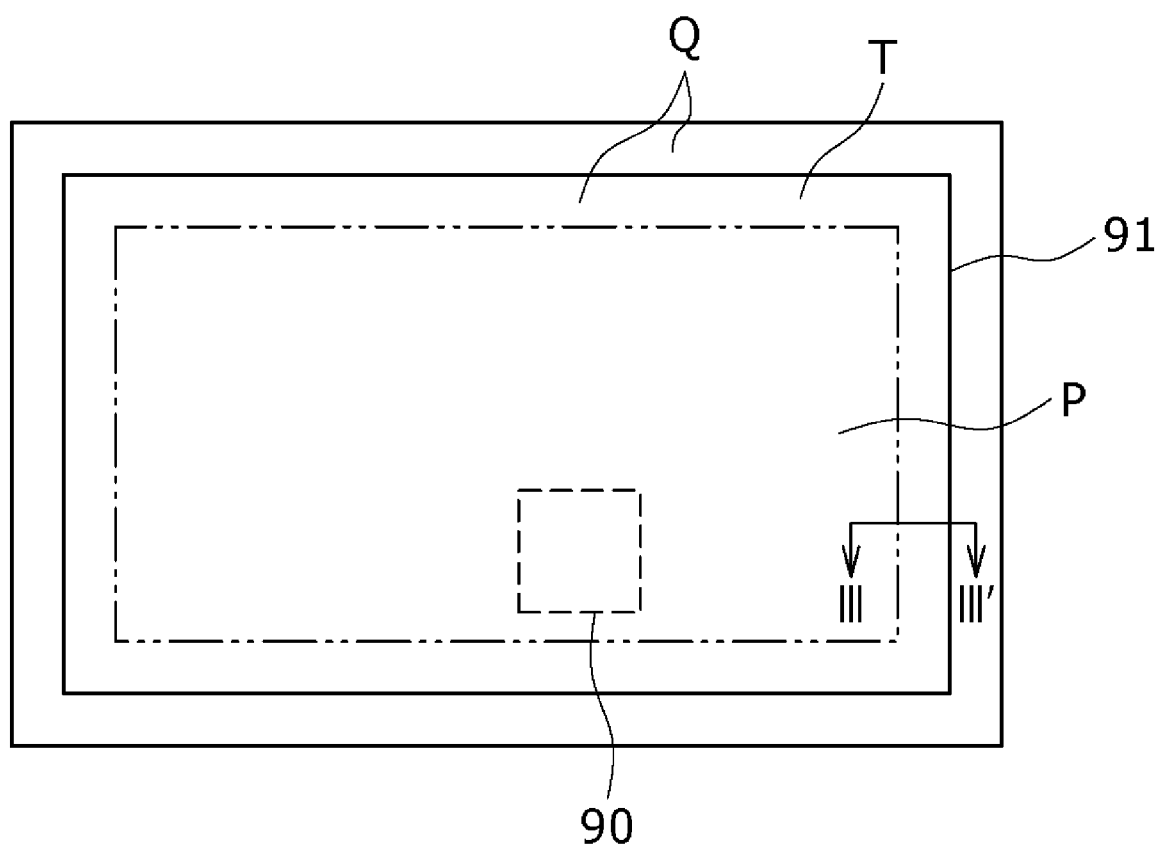
FIG. 1 is a plan view showing a configuration example of a display device according to a first embodiment.

The configuration of a display device according to a first embodiment will be described below. FIG. 1 is a plan view showing the configuration of the display device according to the first embodiment. This display device is an active-matrix display device in which a TFT as a switching element is connected to each of organic EL elements arranged in a matrix and the light emission of each organic EL element is controlled by the TFT.

In FIG. 1, a display area P surrounded by the two-dot chain line is an area in which the organic EL elements that emit light of red (R), green (G), and blue (B) are arranged in a matrix. One organic EL element forms one sub-pixel. The organic EL element that emits R light forms an R sub-pixel. The organic EL element that emits G light forms a G sub-pixel. The organic EL element that emits B light forms a B sub-pixel. The R sub-pixel, the G sub-pixel, and the B sub-pixel form one pixel.

A peripheral area Q surrounding the display area P is an area in which e.g. a drive circuit to send a scan signal and a data signal to the organic EL elements is provided.

A separator 91 to divide a planarization insulating film provided above the TFT is provided at an inside part or an end part of the peripheral area Q in such a manner as to surround the display area P. By this separator 91, the planarization insulating film is divided into a planarization insulating film 13 in the area inside the separator 91 and a planarization insulating film in the area outside the separator 91. This separator 91 can suppress the entry of water in the planarization insulating film in the area outside the separator 91 into the display area P through the planarization insulating film.

Display Area

Figure 2:
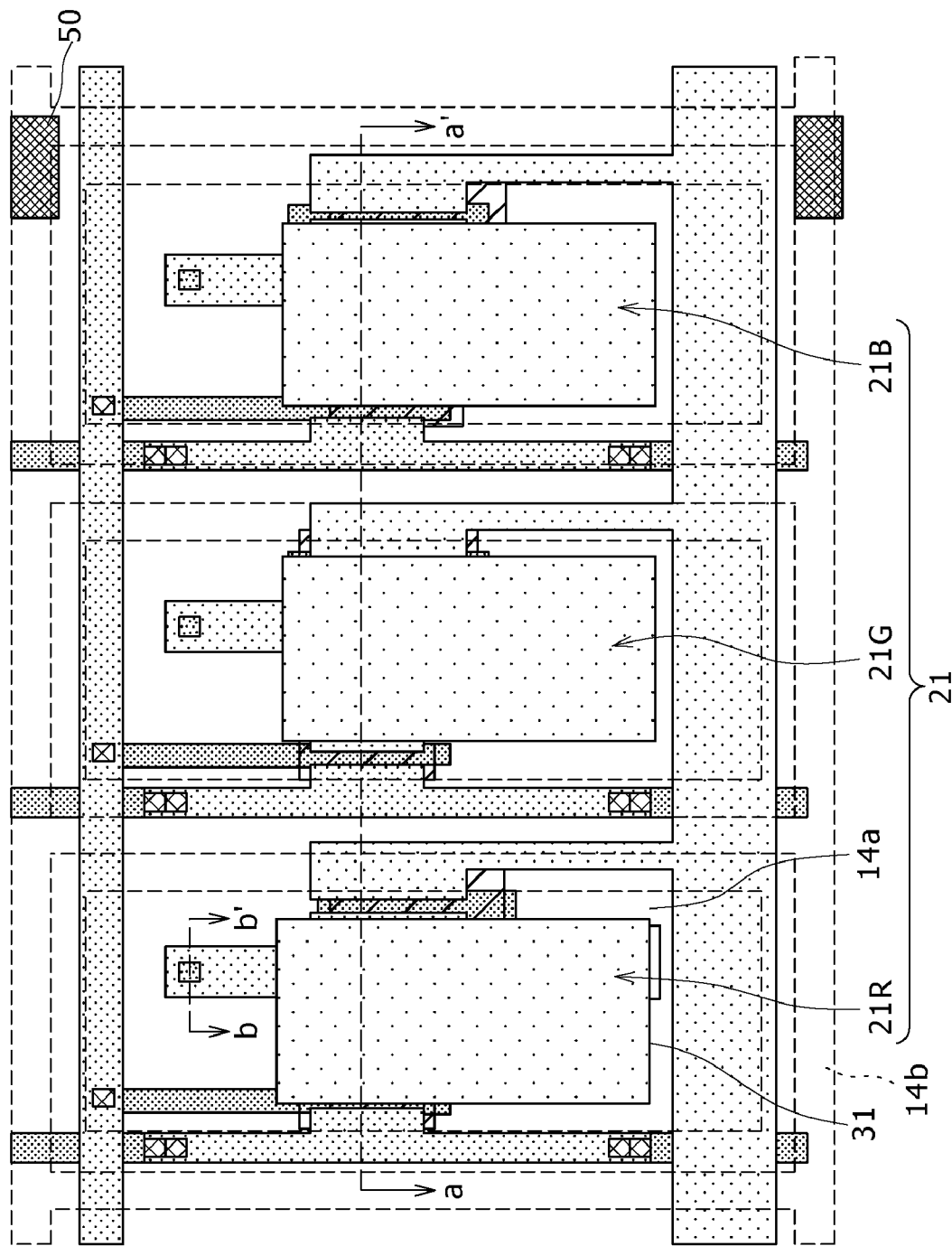
FIG. 2 is a plan view showing a configuration example of a display area.
Figure 3:
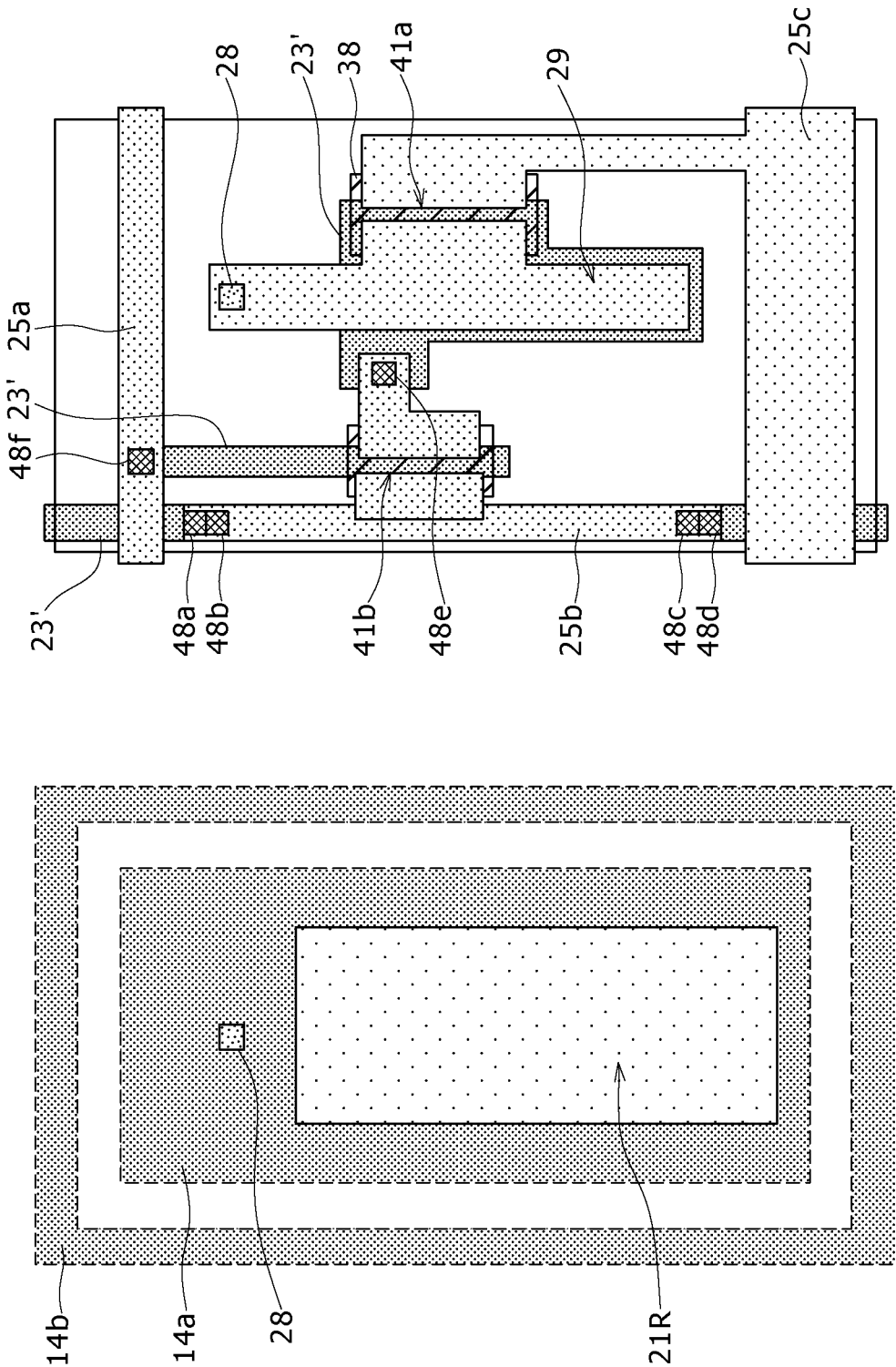
FIGS. 3A and 3B are plan views showing the configuration of a first electrode, an auxiliary interconnect, and so forth.

The detailed configuration of the display area P will be described below. FIG. 2 is an enlarged plan view of an area 90 as part of the display area P, surrounded by the dotted line in FIG. 1. FIG. 3A is a plan view showing the configuration of a first electrode 14a and an auxiliary interconnect 14b. FIG. 3B is a plan view showing the configuration of the circuit including the TFT.

An aperture 31 shown in FIG. 2 is an aperture formed in an aperture-defining insulating film on the planarization insulating film. An organic EL element 21 is formed by stacking an organic layer 17 and a second electrode 18 over the first electrode 14a exposed through this aperture 31. In the display area P, an organic EL element 21R that emits R light, an organic EL element 21G that emits G light, and an organic EL element 21B that emits B light are juxtaposed.

As shown in FIG. 3A, the auxiliary interconnect 14b is formed in the same metal layer as that of the first electrode 14a and is so provided in a lattice manner as to surround the first electrode 14a included in the organic EL element 21. The auxiliary interconnects 14b provided in a lattice manner are coupled to each other across the display area P and formed evenly in the whole of the display area. The first electrode 14a and the auxiliary interconnect 14b are partitioned by the aperture-defining insulating film to thereby be electrically insulated from each other.

This auxiliary interconnect 14b is connected to a contact pad provided in a contact-disposed part 50 shown in FIG. 2, and the auxiliary interconnect 14b and the second electrode are electrically connected to each other via the contact pad. The auxiliary interconnect 14b is formed evenly in the whole of the display area, and the electrical connection between the auxiliary interconnect 14b and the second electrode 18 makes it possible to suppress variation in the potential in the plane of the second electrode 18. The detailed structure of the contact-disposed part 50 will be described later.

As shown in FIG. 3B, the circuit including the TFT is configured. This circuit is configured by a drive transistor 41a and a write transistor 41b that are formed by the TFT, an accumulating capacitor 29, a scan line 25a, a signal line 25b, a power supply control line 25c, and so forth. By connection contacts 48a to 48f, a first metal layer 23' forming the gate electrodes of the drive transistor 41a and the write transistor 41b and so forth is electrically connected to a second metal layer 25 forming the scan line 25a, the signal line 25b, the power supply control line 25c, and so forth.

Figure 4:
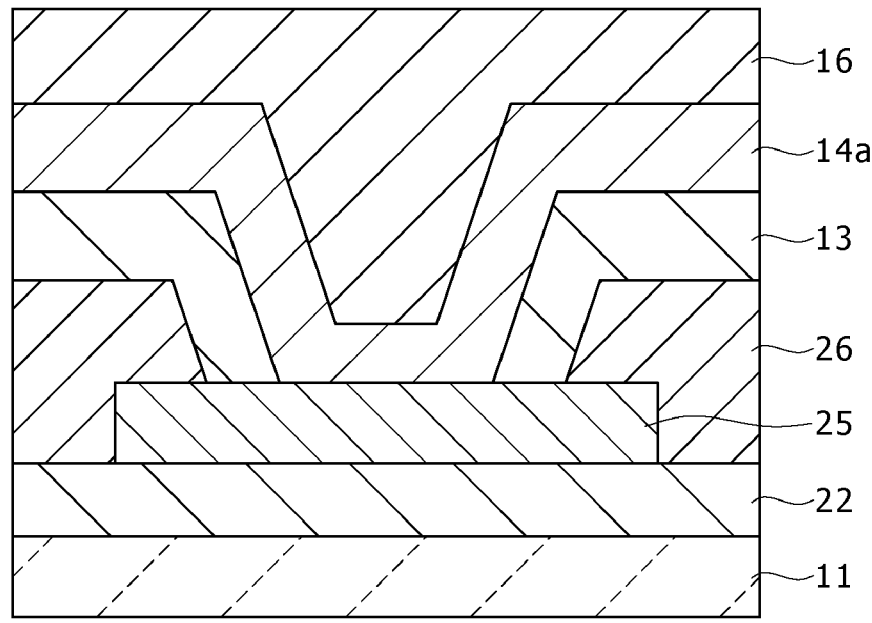
FIG. 4 is a sectional view showing a configuration example of a connection contact.

By a connection contact 28, the second metal layer 25 is electrically connected to a third metal layer forming the first electrode 14a and the auxiliary interconnect 14b. Specifically, as shown in FIG. 4 (sectional view along line b-b' in FIG. 2), the second metal layer 25 formed on a gate insulating film 22 partially has an exposed surface that is not covered by a passivation film 26 and the planarization insulating film 13. This exposed surface is connected to the first electrode 14a (third metal layer) formed on the planarization insulating film 13 via an aperture formed in the planarization insulating film 13.

Figure 5:
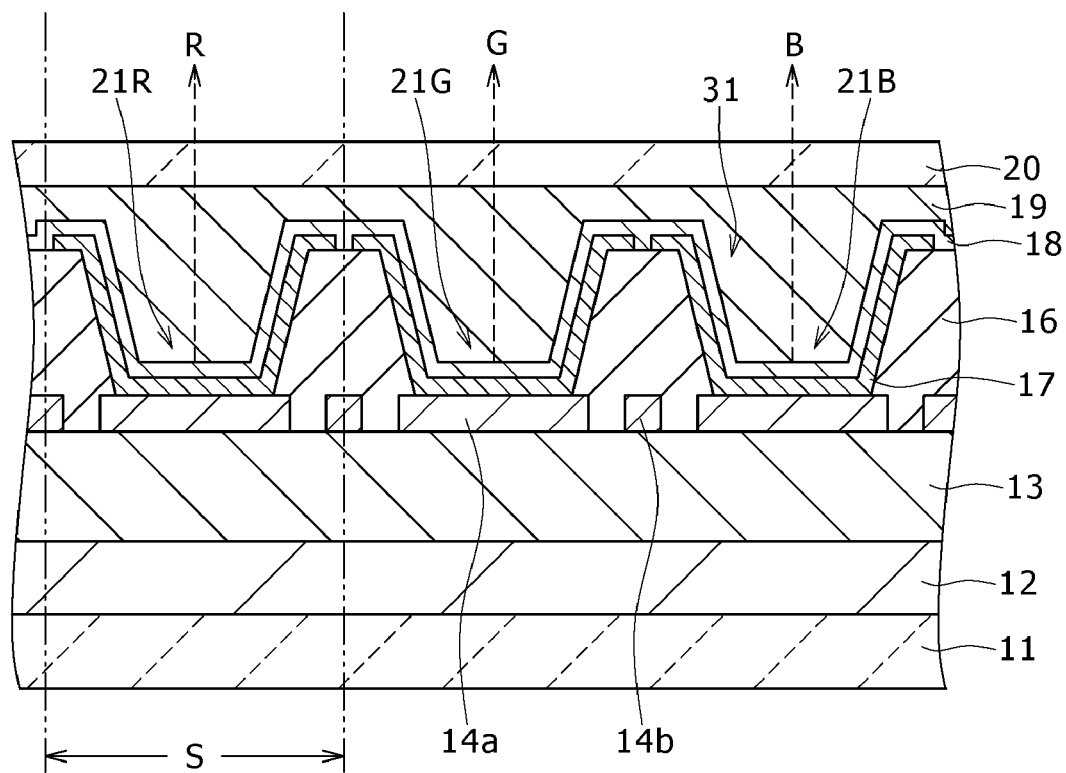
FIG. 5 is a sectional view showing a configuration example of the display area.

FIG. 5 shows a section along line a-a' in FIG. 2 (plan view). As shown in FIG. 5, a circuit-formed layer 12 in which the circuit including the TFT is formed exists on a substrate 11, and the planarization insulating film 13 is formed on this circuit-formed layer 12. On the planarization insulating film 13, the first electrodes 14a arranged in a matrix and the auxiliary interconnect 14b provided around the first electrode 14a are formed. An aperture-defining insulating film 16 on the first electrodes 14a has the apertures 31 that match the first electrodes 14a arranged in a matrix. The organic EL element 21 is formed by stacking the organic layer 17 and the second electrode 18 over the first electrode 14a exposed through the aperture 31.

In the display area P, except for a protective layer 19 and a sealing substrate 20, the layers over the planarization insulating film 13 have a stacking structure of first electrode 14a/organic layer 17/second electrode 18. Furthermore, the layers have a stacking structure of auxiliary interconnect 14b/aperture-defining insulating film 16/second electrode 18 and a stacking structure of auxiliary interconnect 14b/aperture-defining insulating film 16/organic layer 17/second electrode 18. In addition, the layers have a stacking structure of aperture-defining insulating film 16/second electrode 18 (not shown) and a stacking structure of aperture-defining insulating film 16/organic layer 17/second electrode 18.

That is, the display area P includes a structure in which the first electrode 14a or the aperture-defining insulating film 16 intervenes between the organic layer 17 and the planarization insulating film 13. Furthermore, the display area P includes a structure in which the first electrode 14a and the organic layer 17 stacked on the first electrode 14a intervene between the second electrode 18 and the planarization insulating film 13. In addition, the display area P includes a structure in which the auxiliary interconnect 14b and the aperture-defining insulating film 16 stacked on the auxiliary interconnect 14b intervene between the second electrode 18 and the planarization insulating film 13. Moreover, the display area P includes a structure in which the auxiliary interconnect 14b, the aperture-defining insulating film 16 stacked on the auxiliary interconnect 14b, and the organic layer 17 stacked on the aperture-defining insulating film 16 intervene between the second electrode 18 and the planarization insulating film 13. Furthermore, the display area P includes a structure in which the aperture-defining insulating film 16 intervenes between the second electrode 18 and the planarization insulating film 13. In addition, the display area P includes a structure in which the aperture-defining insulating film 16 and the organic layer 17 stacked on the aperture-defining insulating film 16 intervene between the second electrode 18 and the planarization insulating film 13. Due to these structures, the diffusion of water included in the planarization insulating film 13 into the organic layer 17 and the second electrode 18 can be suppressed and the deterioration of the organic layer 17 and the second electrode 18 can be suppressed. Furthermore, the deterioration of the organic layer 17 and the second electrode 18 due to degassing from the planarization insulating film 13 can be suppressed.

Figure 6:
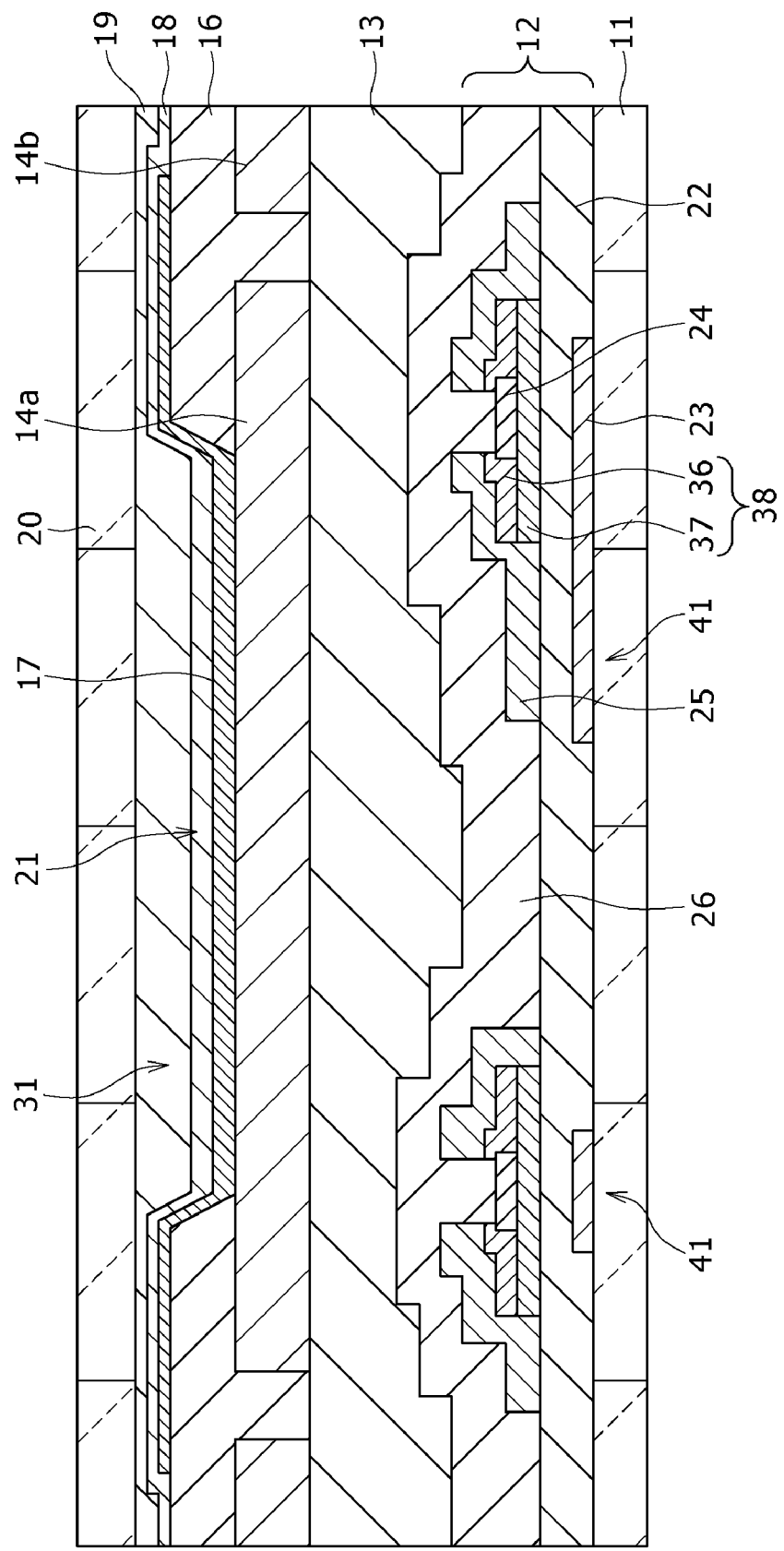
FIG. 6 is an enlarged sectional view showing a configuration example of the display area.

FIG. 6 is an enlarged sectional view of an area S in FIG. 5. As shown in FIG. 6, the first electrode 14a is formed on the planarization insulating film 13. As described above, this first electrode 14a is formed into a matrix. The aperture-defining insulating film 16 is so formed as to have the aperture 31 that matches the position of the first electrode 14a. In this aperture 31, the organic layer 17 and the second electrode 18 are stacked in that order over the first electrode 14a exposed through the aperture-defining insulating film 16, and thereby the organic EL element 21 is formed.

[First Electrode]

The first electrode 14a is an electrode (anode electrode) to inject holes into a light emitting layer (not shown) included in the organic layer 17, and is patterned into a matrix on the planarization insulating film 13. The first electrode 14a functions as a reflective electrode to reflect light from the light emitting layer and lead the light to the upper side. As the material of the first electrode 14a, a material having high reflectivity, specifically e.g. Al or an alloy composed mainly of Al such as an AlNd alloy or AlCe, is used. Such a material of the first electrode has a characteristic that its surface is easily oxidized (surface oxidation characteristic).

[Organic Layer]

The organic layer 17 has e.g. a structure obtained by stacking a hole injection layer, a hole transport layer, a light emitting layer, and an electron transport layer in that order from the side of the first electrode 14a, although not shown in the drawing. The hole injection layer is a layer provided to smoothly accept holes from the first electrode 14a. The hole transport layer is a layer provided to smoothly move holes to the light emitting layer. The electron transport layer is a layer to receive electrons from the second electrode 18 and transport the electrons to the light emitting layer. As the materials of the respective layers of the organic layer 17, organic materials suitable for the functions of the respective layers are arbitrarily used.

In the organic EL element 21, in response to application of the necessary voltage-current between the first electrode 14a and the second electrode 18, holes from the first electrode 14a and electrons from the second electrode 18 are injected into the light emitting layer, and the holes and the electrons are recombined in the light emitting layer, so that light is emitted. In the light emission of the organic EL element 21, light of the color corresponding to the material of the organic layer 17 is emitted.

[Second Electrode]

The second electrode 18 is an electrode (cathode electrode) to inject electrons into the light emitting layer. The second electrodes 18 of the plural organic EL elements 21 are coupled to each other and serve as an electrode common to the respective organic EL elements 21. The second electrode 18 allows the passage of light from the light emitting layer therethrough and outputs the light to the upper side. Therefore, it is a transparent or semi-transparent electrode. As the material of the second electrode 18, a transparent material or a semi-transparent material is used. Examples of such a material include transparent materials such as ITO and IZO and semi-transparent materials such as an MgAg alloy, Cu, Ag, Mg, and Al.

[Planarization Insulating Film]

The planarization insulating film 13 is a film for planarizing the layer structure and forming the organic EL element 21 thereon. The planarization insulating film 13 is composed of e.g. a photosensitive, insulating material such as a polyimide resin, a polybenzoxazole resin, a novolac resin, polyhydroxystyrene, or an acrylic resin.

[Aperture-Defining Insulating Film]

The aperture-defining insulating film 16 is composed of e.g. a photosensitive, insulating material such as a polyimide resin, a polybenzoxazole resin, a novolac resin, polyhydroxystyrene, or an acrylic resin, similarly to the planarization insulating film 13. This aperture-defining insulating film 16 is provided to ensure insulation between the first electrode and the second electrode and define the area in which the organic EL element is formed.

The aperture-defining insulating film 16 and the planarization insulating film 13 may be composed of either the same material or different materials. In terms of the manufacturing steps and so forth, water, gasses, and so forth would be sufficiently removed from the aperture-defining insulating film 16, whereas water, gasses, and so forth would not be sufficiently removed from the planarization insulating film 13. Therefore, there is no problem even when the aperture-defining insulating film 16 is in contact with the second electrode 18 and the organic layer 17, which deteriorate due to water, gasses, and so forth. However, the contact of the planarization insulating film 13 with the second electrode and the organic layer should be avoided.

[Auxiliary Interconnect]

The auxiliary interconnect 14b is formed around the first electrode 14a and is to suppress in-plane unevenness of the electrode voltage in the second electrode 18, which has high resistance and is transmissive, as described above. This auxiliary interconnect 14b is so formed as to have resistance lower than that of the second electrode 18 (e.g. by using a material having low resistivity). The auxiliary interconnect 14b is formed by using the same metal layer as that of the first electrode 14a.

[Circuit-Formed Layer]

In the circuit-formed layer 12, a TFT as a drive element for light emission driving of the organic EL element 21 is formed. The TFT 41 is formed e.g. through repetition of film deposition by CVD and sputtering and pattern formation by photolithography.

The TFT 41 forms the drive transistor 41a and the write transistor 41b. The TFT 41 is configured by a gate electrode 23 composed of molybdenum or the like, the gate insulating film 22, a semiconductor layer 38 composed of a μc-Si film 36 and an $n^+$-Si film 37, an etching stopper 24, the second metal layer 25, and the passivation film 26.

(Second Metal Layer)

The second metal layer 25 forms the source electrode and drain electrode of the TFT 41 and functions also as interconnects such as the signal line 25b. This second metal layer 25 is composed of the same material as that of the contact pad disposed in the contact-disposed part 50. Specifically, the second metal layer 25 is composed of e.g. an electrically-conductive material that has the surface having high resistance to oxidization and allows favorable connection (preferably, ohmic connection) with the second electrode 18. Furthermore, it is preferable that the second metal layer 25 be composed of a material showing a high etching selection ratio with respect to the material of the first electrode 14a and the auxiliary interconnect 14b. This is to prevent the contact pad from being also etched together in etching of the first electrode 14a and the auxiliary interconnect 14b.

More specific examples of the material include Ti, titanium nitride, tungsten, chromium, gold, platinum, copper, ITO, IZO, silver, and alloys composed mainly of any of these metal materials. Alternatively, the second metal layer 25 may be formed of a multilayer film including a Ti layer as the uppermost layer, such as Ti/Al (aluminum), Ti/Al/Ti, Ti/(AlSi alloy), Ti/(AlSiCu alloy), or Ti/(AlCe (cerium) alloy). The material of the second metal layer 25 is properly selected depending on the material of the first electrode 14a and the auxiliary interconnect 14b, the etching method, and so forth.

(Passivation Film)

The passivation film 26 is to protect the TFT 41 and is formed by using e.g. an insulating material composed of at least one kind from $SiO_2$, SiN, and SiON.

[Protective Layer]

The protective layer 19 is formed by using a passivation film composed of a transparent dielectric. As the material of the protective layer 19, $SiO_2$, SiN, or the like can be used.

[Sealing Substrate]

The sealing substrate 20 is bonded to an adhesive layer (not shown) formed on the protective layer 19 and seals the organic EL element 21. The sealing substrate 20 is composed of e.g. a transparent material such as glass.

Contact-Disposed Part

Figure 7:
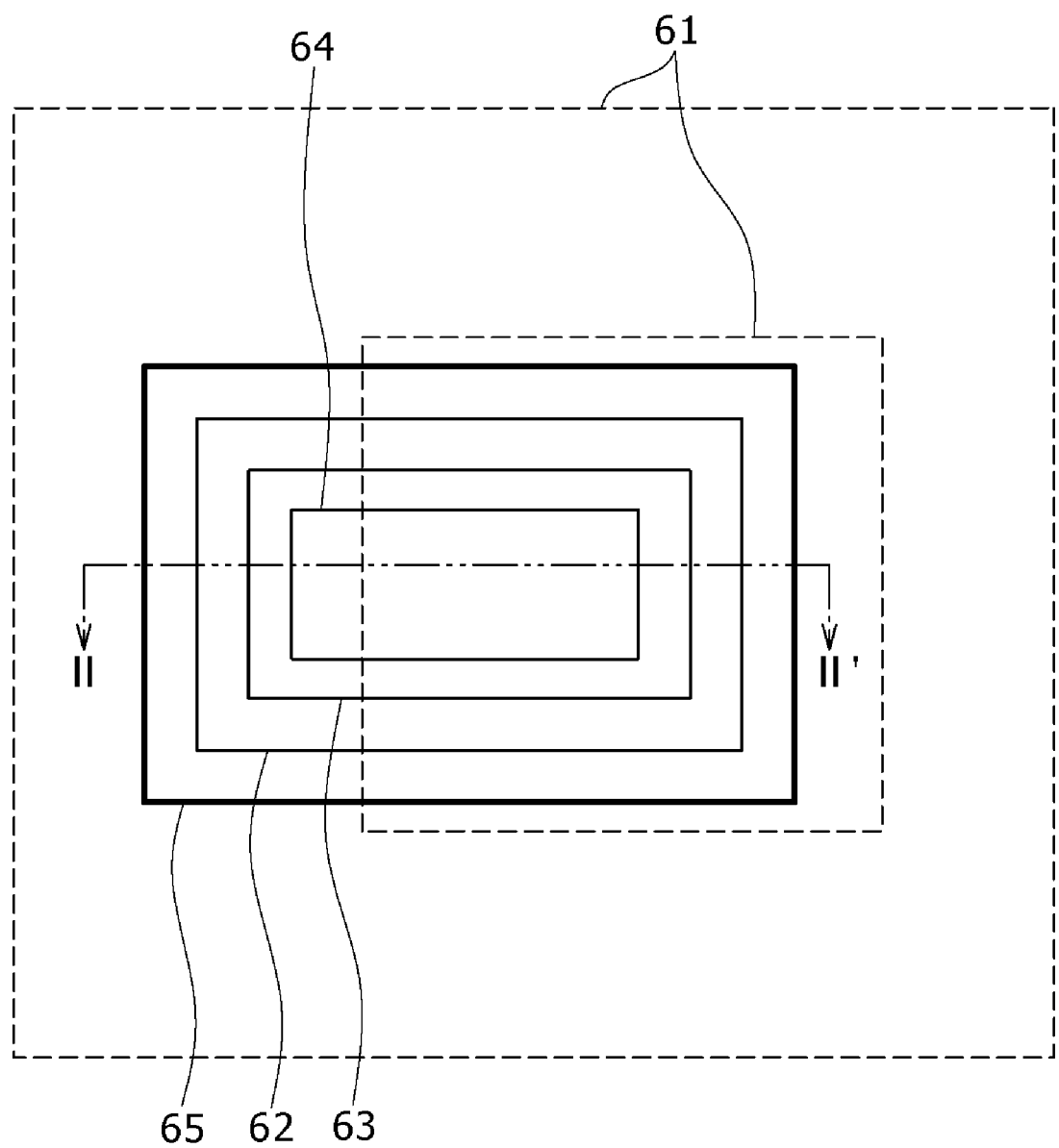
FIG. 7 is a plan view showing a configuration example of a contact-disposed part.

The contact-disposed part 50 will be described below. FIG. 7 is a plan view obtained when the contact-disposed part 50 is viewed from the upper surface side.

In FIG. 7, the area surrounded by dotted lines 61 (area between the inner dotted line and the outer dotted line) indicates the area in which the auxiliary interconnect 14b is formed. The area surrounded by a line 62 indicates the removal part of the passivation film 26. The area surrounded by a line 63 indicates the removal part of the planarization insulating film 13. The area surrounded by a line 64 indicates the removal part of the aperture-defining insulating film 16. The area surrounded by a heavy line 65 indicates the area in which a contact pad 51 is formed.

Figure 8:
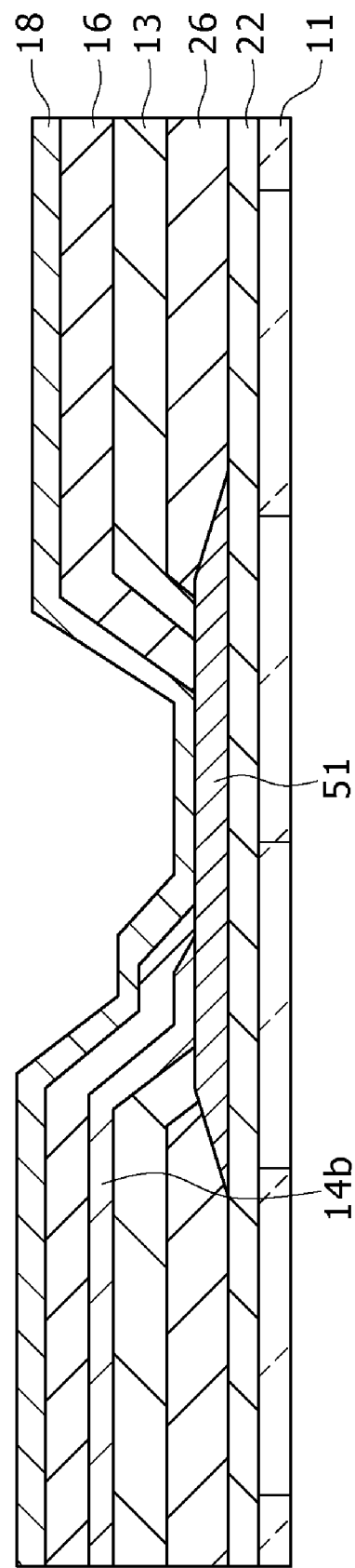
FIG. 8 is a sectional view showing the configuration example of the contact-disposed part.

FIG. 8 is a sectional view along line II-II' in FIG. 7. As shown in FIG. 8, the gate insulating film 22 is stacked on the substrate 11, and the contact pad 51 in the same layer as that of the second metal layer 25 is formed on a partial area of the gate insulating film 22. The contact pad 51 is formed by using the same material as that of the second metal layer 25 with the same thickness as that of the second metal layer 25 for example. The formation area of the contact pad 51 corresponds to the area surrounded by the heavy line 65 shown in FIG. 7.

In the passivation film 26, an aperture through which part of the contact pad 51 is exposed is formed. The formation area of this aperture corresponds to the area surrounded by the line 62 shown in FIG. 7. In the planarization insulating film 13, an aperture for connecting the auxiliary interconnect 14b formed on the planarization insulating film 13 to the contact pad 51 is formed. This aperture corresponds to the area surrounded by the line 63 in FIG. 7. The auxiliary interconnect 14b is formed to the upper surface of the contact pad 51 along part of the inner wall surface of the aperture by the planarization insulating film 13.

The aperture-defining insulating film 16 is formed to the upper surface of the contact pad 51 along this auxiliary interconnect 14b or along the inner wall surface of the aperture by the planarization insulating film 13 on which the auxiliary interconnect 14b is not formed. Thereby, the aperture-defining insulating film 16 forms an aperture for connecting the second electrode 18 formed on the aperture-defining insulating film 16 to the contact pad 51. The second electrode 18 is uniformly formed across the surface forming this aperture and the upper surface of the contact pad 51.

In the contact-disposed part 50, the auxiliary interconnect 14b is electrically connected to the contact pad 51. Furthermore, the second electrode 18 is electrically connected to the contact pad 51. In addition, the auxiliary interconnect 14b is electrically connected to the second electrode 18 via the contact pad 51. Thereby, the auxiliary interconnect 14b is electrically connected to the second electrode 18 via the contact pad 51, which allows favorable connection (preferably, ohmic connection) with the second electrode 18. Therefore, even if the surface of the auxiliary interconnect 14b composed of a material that is easily oxidized is oxidized, increase in the contact resistance between the second electrode 18 and the auxiliary interconnect 14b is avoided.

In the contact-disposed part 50, the auxiliary interconnect 14b and the aperture-defining insulating film 16 with a structure obtained by stacking them in that order are formed along the inner wall surface of the aperture by the planarization insulating film 13, or the aperture-defining insulating film 16 is formed along the inner wall surface of the aperture by the planarization insulating film 13. That is, the inner wall surface of the aperture by the planarization insulating film 13 is covered by two layers of the auxiliary interconnect 14b and the aperture-defining insulating film 16 or one layer of the aperture-defining insulating film 16. This can avoid direct contact between the planarization insulating film 13 and the second electrode, and can suppress the deterioration of the second electrode 18 and the organic layer 17 due to water included in the planarization insulating film 13 and degassing from the planarization insulating film 13.

Furthermore, in the structure of this contact-disposed part 50, even when recess and projection are formed in the inner wall surface of the aperture by the planarization insulating film 13, two layers of the auxiliary interconnect 14b and the aperture-defining insulating film 16 or one layer of the aperture-defining insulating film 16 intervenes between this inner wall surface and the second electrode 18.

This can alleviate the influence of the recess and projection in the inner wall surface of the aperture by the planarization insulating film 13, and thus can suppress the disconnection of the second electrode 18. That is, problems in the structure of the contact-disposed part 50 of a related art, which will be described below, can be solved. In the following, a related-art structure of the contact-disposed part 50 and the problems thereof will be described in order to facilitate understanding of this invention.

[Related-Art Structure of Contact-Disposed Part and Problems Thereof]

Figure 9:
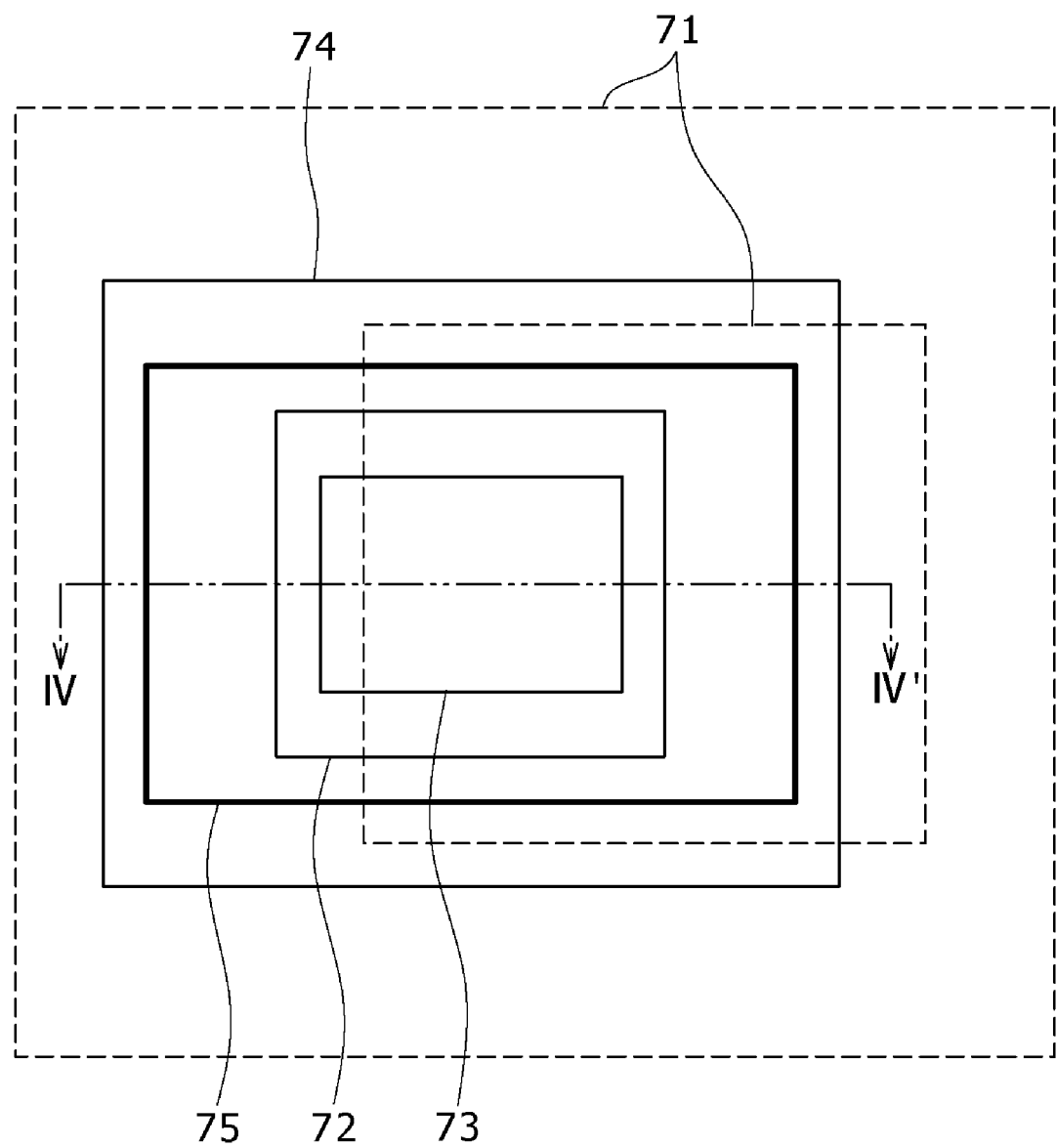
FIG. 9 is a plan view showing a configuration example of the contact-disposed part of a related art.

The related-art structure of the contact-disposed part 50 will be described below. FIG. 9 is a plan view obtained when the contact-disposed part 50 is viewed from the upper surface side.

In FIG. 9, the area surrounded by dotted lines 71 (area between the inner dotted line and the outer dotted line) indicates the area in which the auxiliary interconnect 14b is formed. The area surrounded by a line 72 indicates the removal part of the passivation film 26. The area surrounded by a line 73 indicates the removal part of the planarization insulating film 13. The area surrounded by a line 74 indicates the removal part of the aperture-defining insulating film 16. The area surrounded by a heavy line 75 indicates the area in which the contact pad 51 is formed.

Figure 10:
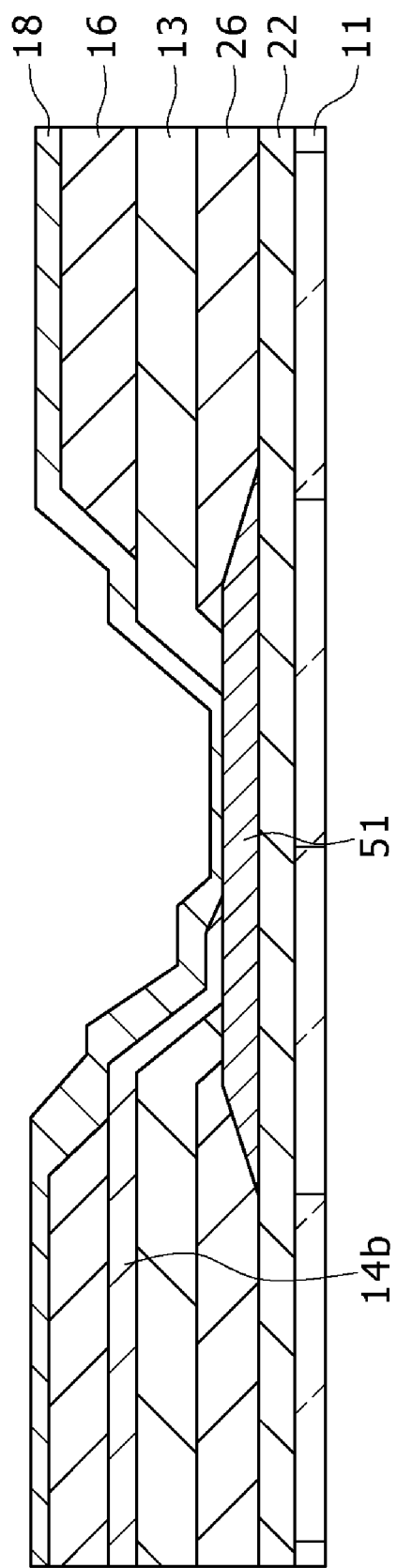
FIG. 10 is a sectional view showing the configuration example of the contact-disposed part of the related art.

As shown in FIG. 10, in the aperture-defining insulating film 16, an aperture for connecting the second electrode 18 provided on the upper layer of the aperture-defining insulating film 16 to the contact pad 51 disposed as a lower layer is formed. The size of the aperture by the aperture-defining insulating film 16 (equivalent to the area surrounded by the line 74 in FIG. 9) is set larger than the size of the aperture by the planarization insulating film 13 (equivalent to the area surrounded by the line 73 in FIG. 9). Thus, the flat surface of the planarization insulating film 13 partially has an exposed surface that is not covered by the aperture-defining insulating film 16. The auxiliary interconnect 14b is formed to part of the upper surface of the contact pad 51 along part of this exposed surface and part of the inner wall surface of the aperture by the planarization insulating film 13.

By the inner wall surface of the aperture by the aperture-defining insulating film 16, the auxiliary interconnect 14b, the inner wall surface of the aperture by the planarization insulating film 13, and the exposed surface of the flat surface of the planarization insulating film 13, an aperture for connecting the second electrode 18 provided on the planarization insulating film 13 to the contact pad 51 is formed. The second electrode 18 is uniformly formed across the surface forming this aperture and the upper surface of the contact pad 51.

Due to this structure, in the contact-disposed part 50, the auxiliary interconnect 14b is electrically connected to the contact pad 51. The second electrode 18 is electrically connected to the contact pad 51. Furthermore, the auxiliary interconnect 14b is electrically connected to the second electrode 18 via the contact pad 51.

Figure 11:
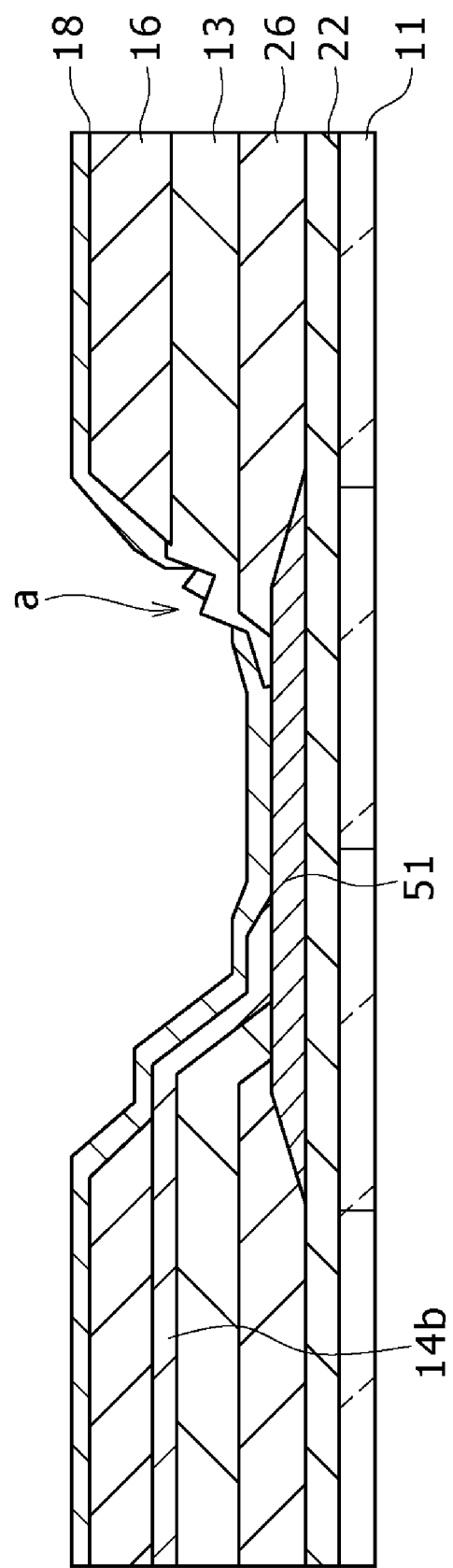
FIG. 11 is a sectional view showing the disconnected state of a second electrode in the contact-disposed part of the related art.

In this related-art structure, the inner wall surface of the aperture by the planarization insulating film 13 is damaged and recess and projection are generated in the step of forming the aperture by the aperture-defining insulating film 16. Specifically, when the exposed part corresponding to the aperture is removed after a photosensitive resin to serve as the aperture-defining insulating film 16 is applied on the planarization insulating film 13, the recess and projection are generated in the inner wall surface of the aperture by the planarization insulating film 13 at the position corresponding to the removed part due to the influence of a removing liquid. If the recess and projection are generated in the inner wall surface of the aperture by the planarization insulating film 13, due to the influence of the recess and projection, the second electrode 18 formed on the inner wall surface of the aperture in which the recess and projection are generated is disconnected like a part shown by arrowhead a in FIG. 11.

In contrast, in the above-described structure of the contact-disposed part 50 in the embodiment, the inner wall surface of the aperture by the planarization insulating film 13 is covered by the auxiliary interconnect 14b and the aperture-defining insulating film 16 or by the aperture-defining insulating film 16. Thereby, two layers of the auxiliary interconnect 14b and the aperture-defining insulating film 16 or one layer of the aperture-defining insulating film intervenes between the inner wall surface of the aperture by the planarization insulating film 13 and the second electrode 18. Therefore, it is possible to suppress the disconnection of the second electrode 18 due to the influence of recess and projection in the inner wall surface of the aperture by the planarization insulating film 13.

Peripheral Area

Figure 12:
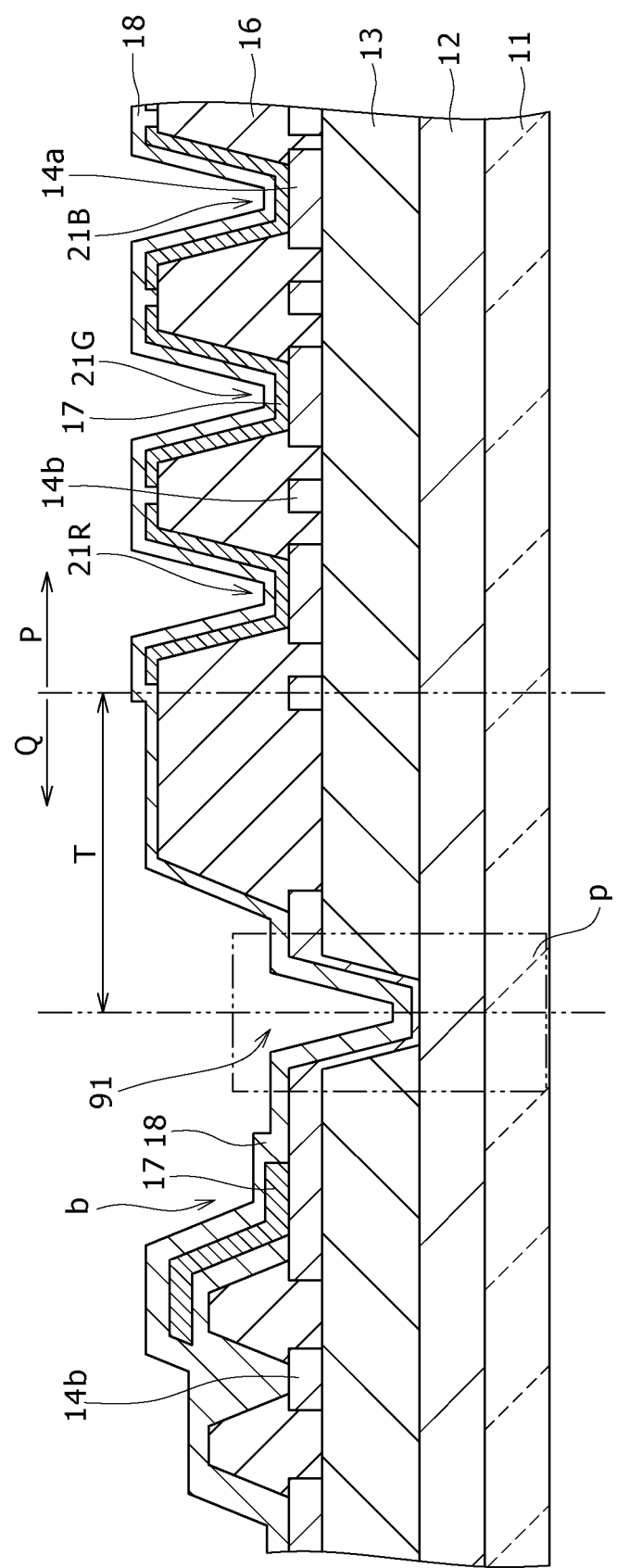
FIG. 12 is a sectional view showing a configuration example of the display area and a peripheral area.

The configuration of the peripheral area Q will be described below. FIG. 12 is a sectional view along line III-III' in FIG. 1. The separator 91 provided between the display area P and the peripheral area Q divides the planarization insulating film 13 into the planarization insulating film 13 on the side of the display area P and the planarization insulating film 13 on the side of the peripheral area Q. Thereby, the planarization insulating film 13 in the peripheral area Q is isolated from the planarization insulating film 13 on the side of the display area P. This can prevent water existing in the peripheral area Q from entering the display area P through the planarization insulating film 13.

In the peripheral area Q, the drive circuit to send a scan signal and a data signal to the organic EL element 21 is formed in the circuit-formed layer 12. Furthermore, a peripheral pixel area b and so forth is formed. The peripheral pixel area b has the same configuration as that of the organic EL element 21, i.e. a structure obtained by stacking the first electrode 14a, the organic layer 17, and the second electrode 18 in that order. Although this peripheral pixel area b has the same configuration as that of the organic EL element 21, it does not emit light actually. This peripheral pixel area b may be formed in the peripheral area Q inside the separator 91.

In an area T that is outside the display area P and inside the separator 91, surrounded by the two-dot chain lines, (this area will be arbitrarily referred to as the peripheral area T inside the separator 91), the planarization insulating film 13 is formed on the circuit-formed layer 12. Furthermore, the auxiliary interconnect 14b is formed on the planarization insulating film 13. In addition, the second electrode 18 is formed on the auxiliary interconnect 14b. Moreover, the aperture-defining insulating film 16 is formed on the surface of the planarization insulating film 13 on which the auxiliary interconnect 14b is not formed. The second electrode 18 is formed on this aperture-defining insulating film 16.

That is, the area T includes a structure in which one layer of the auxiliary interconnect 14b intervenes between the planarization insulating film 13 and the second electrode 18, and a structure in which one layer of the aperture-defining insulating film 16 intervenes between the planarization insulating film 13 and the second electrode 18. Furthermore, the area T includes a structure in which two layers of the auxiliary interconnect 14b and the aperture-defining insulating film 16 intervene between the planarization insulating film 13 and the second electrode 18. Thus, the second electrode 18 is not in direct contact with the planarization insulating film 13. This can suppress the deterioration of the second electrode due to water included in the planarization insulating film 13 and degassing from the planarization insulating film 13.

In the peripheral area T inside the separator 91, the area of the aperture-defining insulating film 16 is set as follows. Specifically, the coverage of the aperture-defining insulating film 16 defined by (Expression 1) shown below is set to a value in the range from 30% to 100%.

(the coverage of the aperture-defining insulating film)
={(the area of the aperture-defining insulating film in the peripheral area $T$ inside the separator/ the area of the peripheral area $T$ inside the separator)}×100(%)     (Expression 1)

This is because, unless the aperture-defining insulating film 16 is so designed as to satisfy the above-described condition, it is impossible to sufficiently suppress the deterioration of the organic material of the organic layer 17 in the display area P and the transformation of the material of the second electrode 18 due to the entry of water remaining in the planarization insulating film 13 and degassing from the planarization insulating film 13.

Separator

Figure 13:
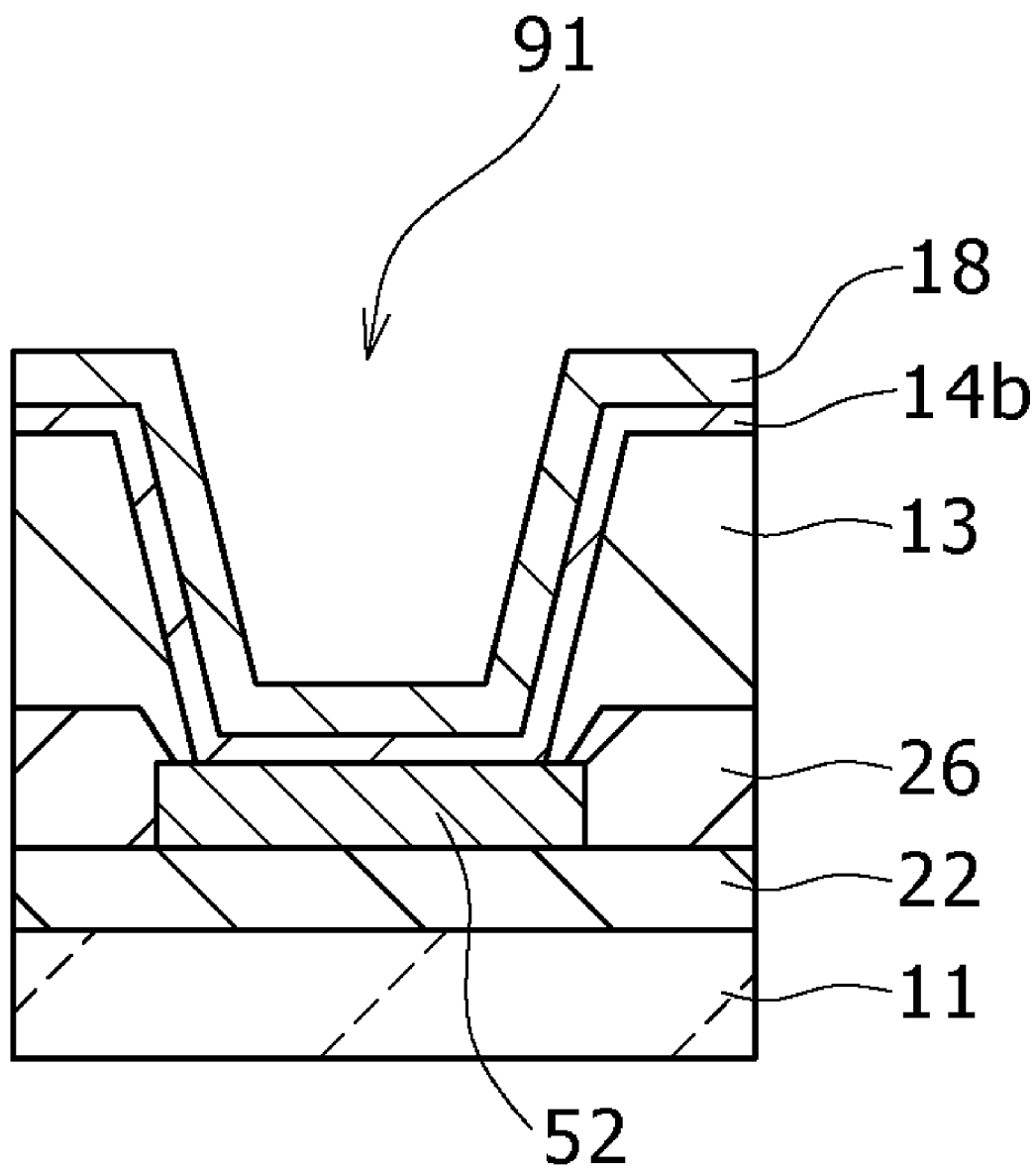
FIG. 13 is a sectional view showing a configuration example of a separator.

The detailed configuration of the separator will be described below. FIG. 13 is an enlarged sectional view of an area p shown in FIG. 12. As shown in FIG. 13, in the separator 91, a contact pad 52 in the same layer as that of the second metal layer 25 partially has an exposed surface that is not covered by the planarization insulating film 13 and the passivation film 26. The auxiliary interconnect 14b is formed across this exposed surface and the surface of the planarization insulating film 13 along which the separator 91 is formed. Furthermore, the second electrode 18 is formed on this auxiliary interconnect 14b.

By this separator 91, the planarization insulating film 13 in the display area P is isolated from the planarization insulating film 13 outside the separator 91. This can suppress the entry of water remaining in the planarization insulating film 13 in the peripheral area Q outside the separator 91 into the display area P.

Method for Manufacturing Display Device

A method for manufacturing the display device according to the first embodiment will be described below. The description of the method for manufacturing the display device will be made with reference to FIG. 14 and FIG. 16, which show the formation process of the area in which the organic EL element 21 is formed, and FIG. 15 and FIG. 17, which show the formation process of the contact-disposed part 50.

Figure 14A:
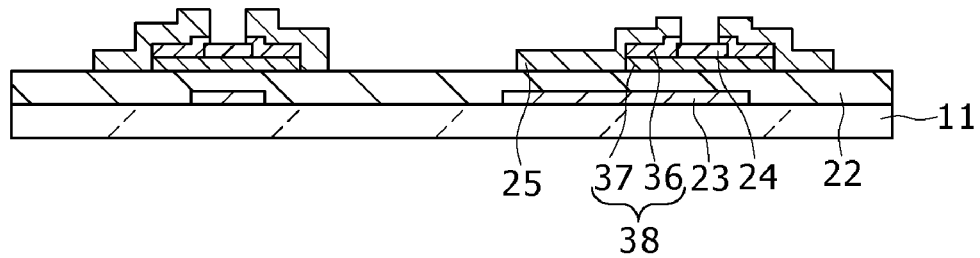
FIGS. 14A to 14C are sectional views for explaining a method for manufacturing the display device.
Figure 15A:
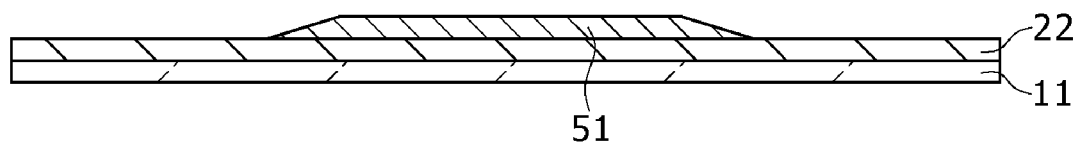
FIGS. 15A to 15C are sectional views for explaining the method for manufacturing the display device.

First, as shown in FIG. 14A, the gate electrode 23, the etching stopper 24, the semiconductor layer 38, and the second metal layer 25 are formed over the substrate 11 through repetition of film deposition by CVD and sputtering and pattern formation by photolithography. In the contact-disposed part 50, as shown in 15A, the contact pad 51 in the same layer as that of the second metal layer 25 is formed on the gate insulating film 22.

Figure 14B:
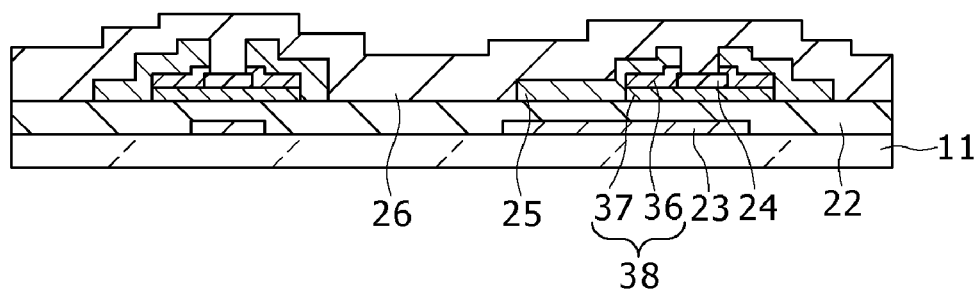
Figure 15B:
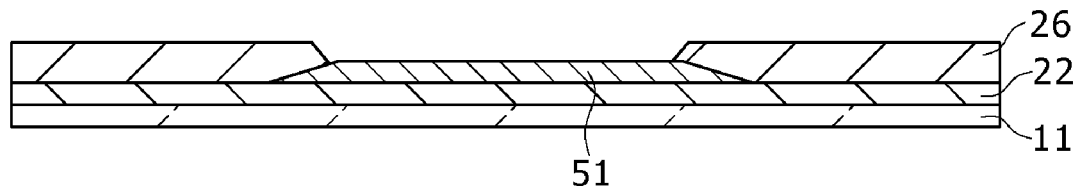

Next, as shown in FIG. 14B, the passivation film 26 covering the TFT 41 is formed by CVD. In the contact-disposed part 50, as shown in FIG. 15B, an aperture through which part of the upper surface of the contact pad 51 is exposed is formed by removing part of the passivation film 26 by photolithography.

Figure 14C:
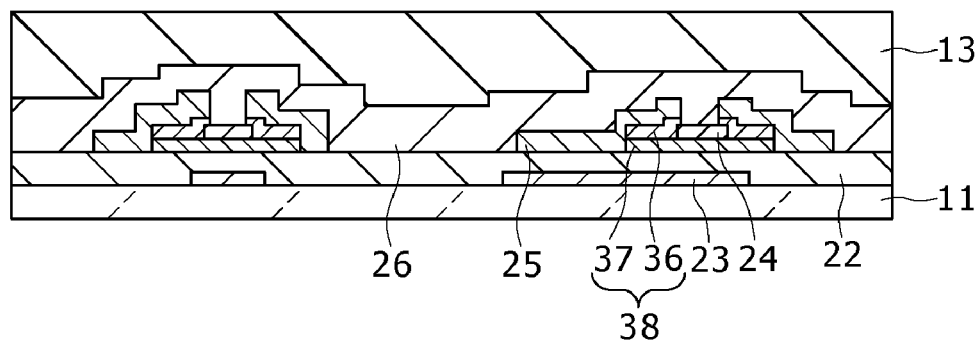
Figure 15C:
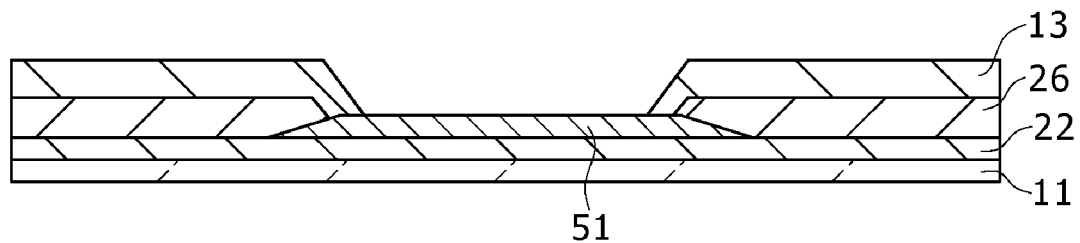

Next, as shown in FIG. 14C, a photosensitive resin to serve as the planarization insulating film 13 is applied on the passivation film 26 by spin-coating. In the contact-disposed part 50, as shown in FIG. 15C, an aperture is formed in the planarization insulating film 13 by photolithography so that the contact pad 51 may be exposed, and thereafter baking is performed. Simultaneously, the part of the planarization insulating film 13 corresponding to the separator 91 is removed by photolithography, so that the separator 91 to divide the planarization insulating film 13 into the planarization insulating film 13 on the side of the display area P and the planarization insulating film 13 on the side of the peripheral area Q is formed (diagrammatic representation is omitted).

Figure 16A:
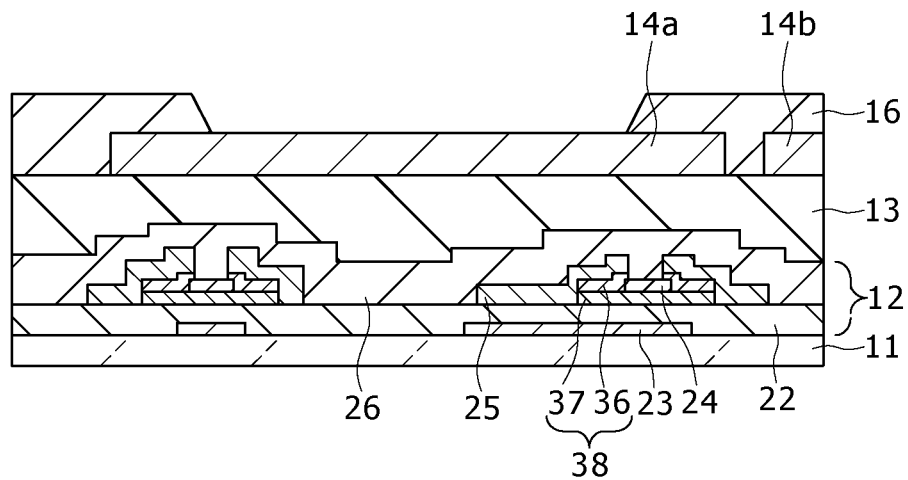
FIGS. 16A to 16C are sectional views for explaining the method for manufacturing the display device.
Figure 17A:
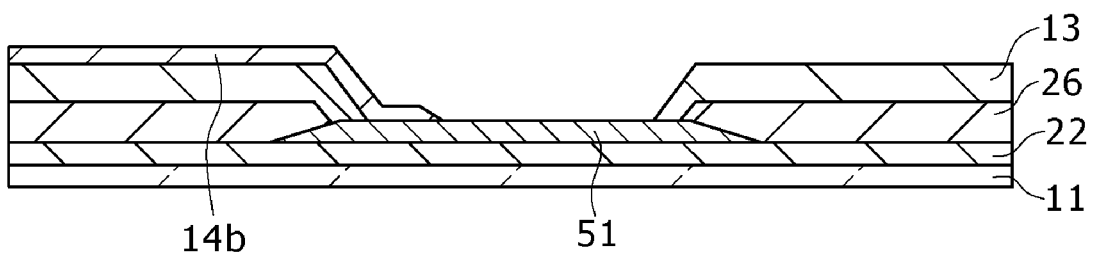
FIGS. 17A to 17C are sectional views for explaining the method for manufacturing the display device.

Next, as shown in FIG. 16A, the first electrode 14a and the auxiliary interconnect 14b are formed by sputtering and patterning into a predetermined shape by photolithography and etching. In the contact-disposed part 50, as shown in FIG. 17A, the auxiliary interconnect 14b is so patterned as to be formed to part of the upper surface of the contact pad 51 along part of the inner wall surface of the aperture by the planarization insulating film 13.

Figure 16B:
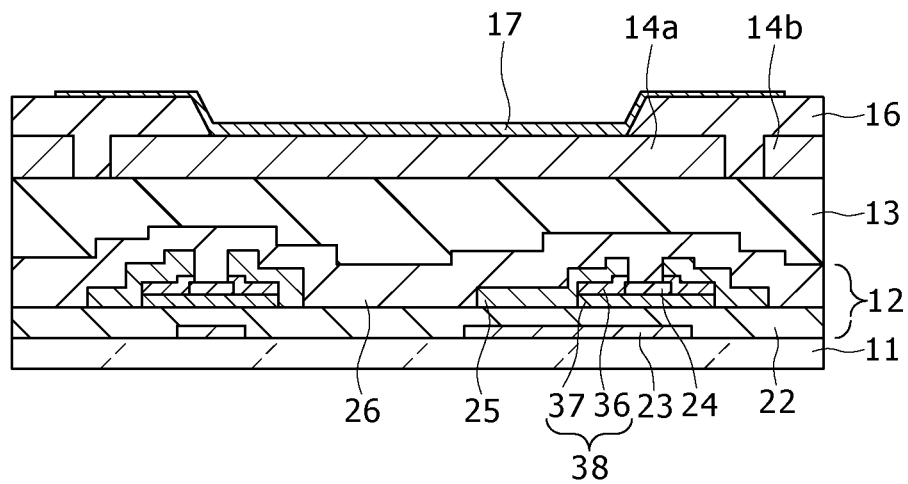
Figure 17B:
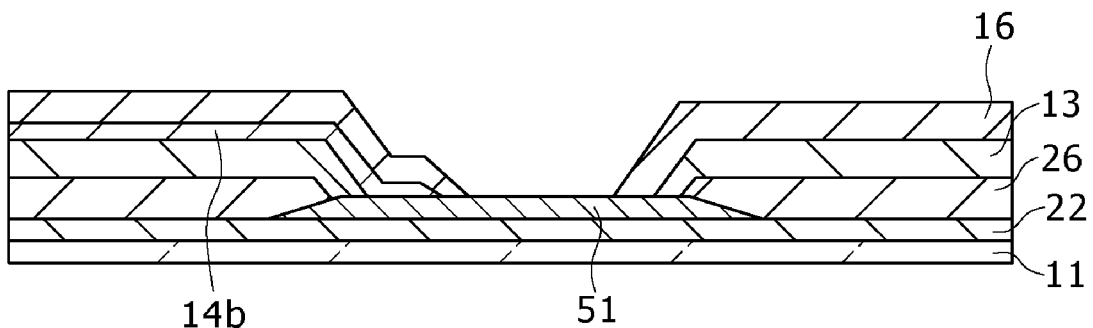

Next, as shown in FIG. 16B, a photosensitive resin to serve as the aperture-defining insulating film 16 is applied on the first electrode 14a and the auxiliary interconnect 14b by spin-coating. Thereafter, an aperture is formed at the position that matches the first electrode 14a by photolithography, and then baking is performed. In the contact-disposed part 50, as shown in FIG. 17B, the aperture-defining insulating film 16 is formed to part of the upper surface of the contact pad 51 along the auxiliary interconnect 14b by photolithography. Furthermore, the aperture-defining insulating film 16 is formed to part of the contact pad 51 along the planarization insulating film 13.

Figure 16C:
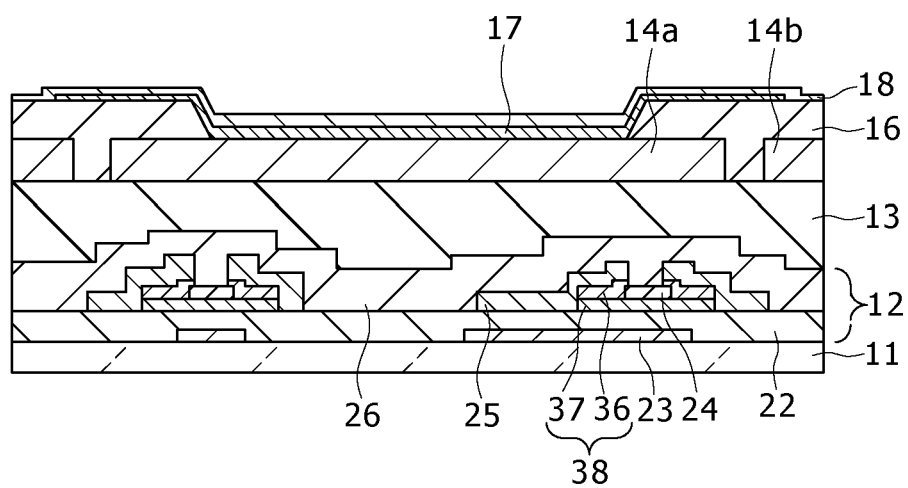
Figure 17C:
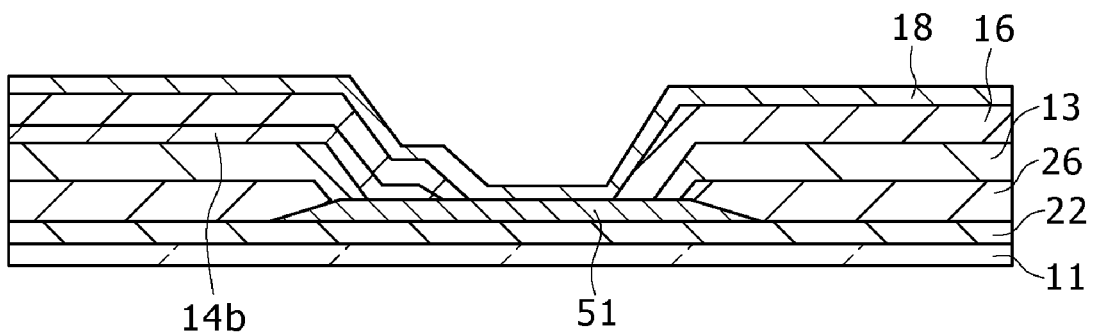

Next, as shown in FIG. 16C, the organic layer 17 is formed on the first electrode 14a exposed through the aperture of the aperture-defining insulating film 16 by vacuum evaporation. The organic layer 17 is formed by depositing a hole injection layer, a hole transport layer, a light emitting layer, and an electron transport layer in that order for example (diagrammatic representation is omitted). In this step, materials corresponding to the respective light emission colors are deposited for the light emitting layer. Furthermore, as shown in FIG. 16C, the second electrode 18 is uniformly formed on the organic layer 17 and the aperture-defining insulating film 16 by vacuum evaporation. In the contact-disposed part 50, as shown in FIG. 17C, the second electrode 18 is uniformly formed on the aperture-defining insulating film 16 and the upper surface of the contact pad 51.

Although not shown in the drawing, thereafter the protective layer 19 is formed on the second electrode 18 by vacuum evaporation. Furthermore, an adhesive layer is formed by spin-coating of a UV-curable resin on the protective layer 19, and the sealing substrate 20 is bonded to the protective layer 19 with the intermediary of the adhesive layer. Through the above-described steps, the display device can be obtained.

Advantageous Effects

In the display device according to the first embodiment, the area inside the separator 91 has the following structures. Specifically, this area includes a structure in which one layer of the auxiliary interconnect 14b intervenes between the planarization insulating film 13 and the second electrode 18. Furthermore, this area includes a structure in which two layers of the first electrode 14a and the organic layer 17 intervene between the planarization insulating film 13 and the second electrode 18. In addition, this area includes a structure in which one layer of the aperture-defining insulating film 16 or two layers of the first electrode 14a or the auxiliary interconnect 14b and the aperture-defining insulating film 16 intervene between the planarization insulating film 13 and the second electrode 18. Due to these structures, the second electrode 18 is not in direct contact with the planarization insulating film 13. This can suppress the deterioration of the second electrode due to water included in the planarization insulating film 13 and degassing from the planarization insulating film 13.

In the display device according to the first embodiment, the area inside the separator 91 has the following structure. Specifically, this area includes a structure in which one layer of the first electrode 14a intervenes between the planarization insulating film 13 and the organic layer 17. Due to this structure, the organic layer 17 is not in direct contact with the planarization insulating film 13. This can suppress the deterioration of the organic layer 17 due to water included in the planarization insulating film 13 and degassing from the planarization insulating film 13. Furthermore, in the display area P, if the protective layer 19 and the sealing substrate 20 are not taken into consideration, the layers over the planarization insulating film 13 have a stacking structure of first electrode 14a/organic layer 17/second electrode 18 and a stacking structure of auxiliary interconnect 14b/aperture-defining insulating film 16/organic layer 17/second electrode 18. In addition, the layers over the planarization insulating film 13 have a stacking structure of aperture-defining insulating film 16/second electrode 18 and a stacking structure of aperture-defining insulating film 16/organic layer 17/second electrode 18.

In the display device according to the first embodiment, in the contact-disposed part 50, the inner wall surface of the aperture by the planarization insulating film 13 is covered by two layers of the auxiliary interconnect 14b and the aperture-defining insulating film 16 or by one layer of the aperture-defining insulating film 16. This can suppress the deterioration of the organic layer 17 and the second electrode 18 due to water included in the planarization insulating film 13 and degassing from the planarization insulating film.

In the display device according to the first embodiment, in the contact-disposed part 50, two layers of the auxiliary interconnect 14b and the aperture-defining insulating film 16 or one layer of the aperture-defining insulating film 16 intervenes between the inner wall surface of the aperture by the planarization insulating film 13 and the second electrode 18. Therefore, it is possible to suppress the disconnection of the second electrode 18 due to the influence of recess and projection in the inner wall surface of the aperture by the planarization insulating film 13.

2. Second Embodiment

Display Device

A display device according to a second embodiment will be described below. The display device according to the second embodiment is the same as the display device according to the first embodiment except for that the configuration of the contact-disposed part 50 is different. Therefore, in the following, the configuration of the contact-disposed part 50 will be described in detail, and description of other configurations is omitted.

Contact-Disposed Part

Figure 18:
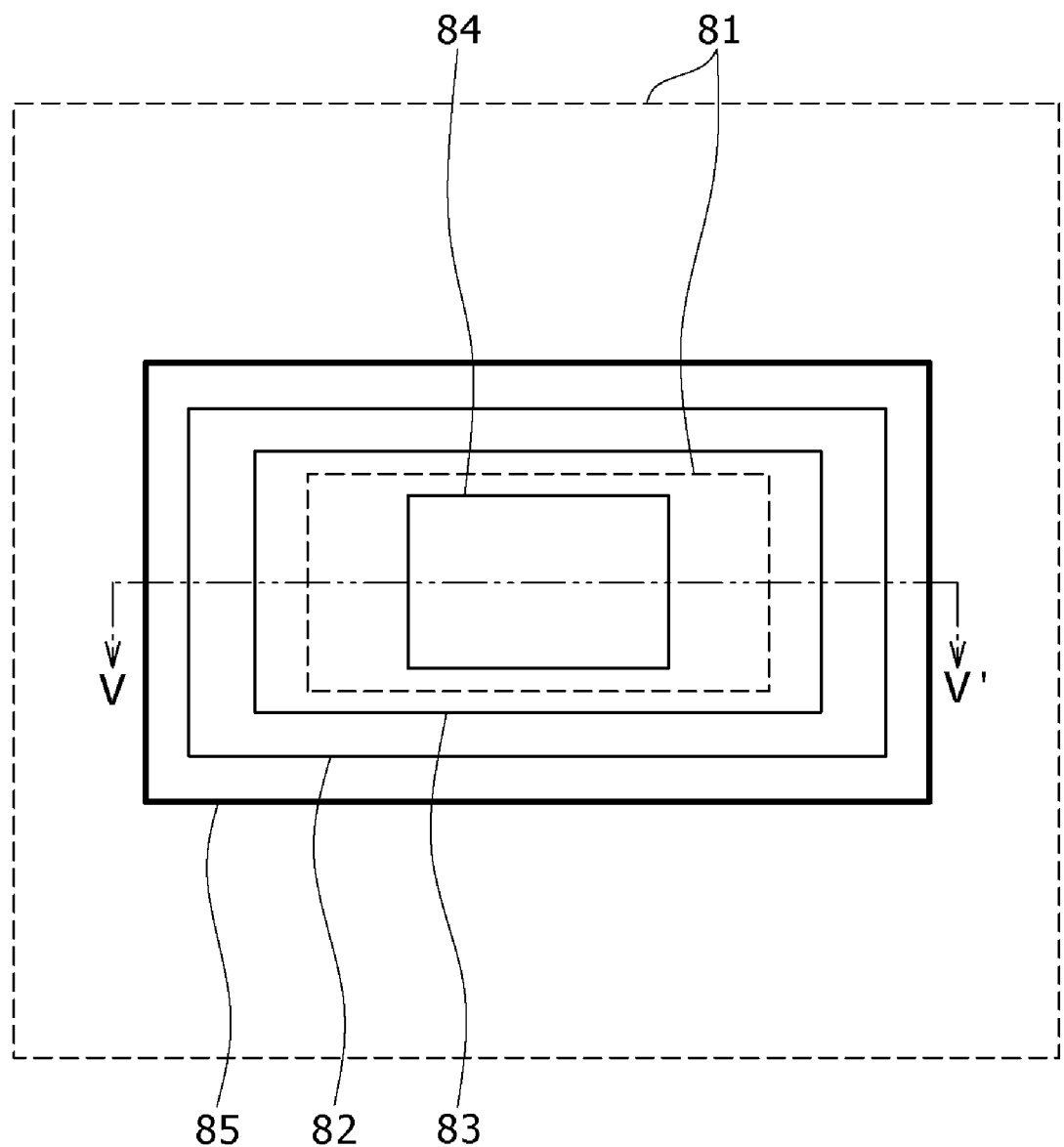
FIG. 18 is a plan view showing a configuration example of the contact-disposed part.

The contact-disposed part 50 will be described below. FIG. 18 is a plan view obtained when the contact-disposed part 50 is viewed from the upper surface side. In FIG. 18, the area surrounded by dotted lines 81 (area between the inner dotted line and the outer dotted line) indicates the area in which the auxiliary interconnect 14b is formed. The area surrounded by a line 82 indicates the removal part of the passivation film 26. The area surrounded by a line 83 indicates the removal part of the planarization insulating film 13. The area surrounded by a line 84 indicates the removal part of the aperture-defining insulating film 16. The area surrounded by a heavy line 85 indicates the area in which the contact pad 51 is formed.

Figure 19:
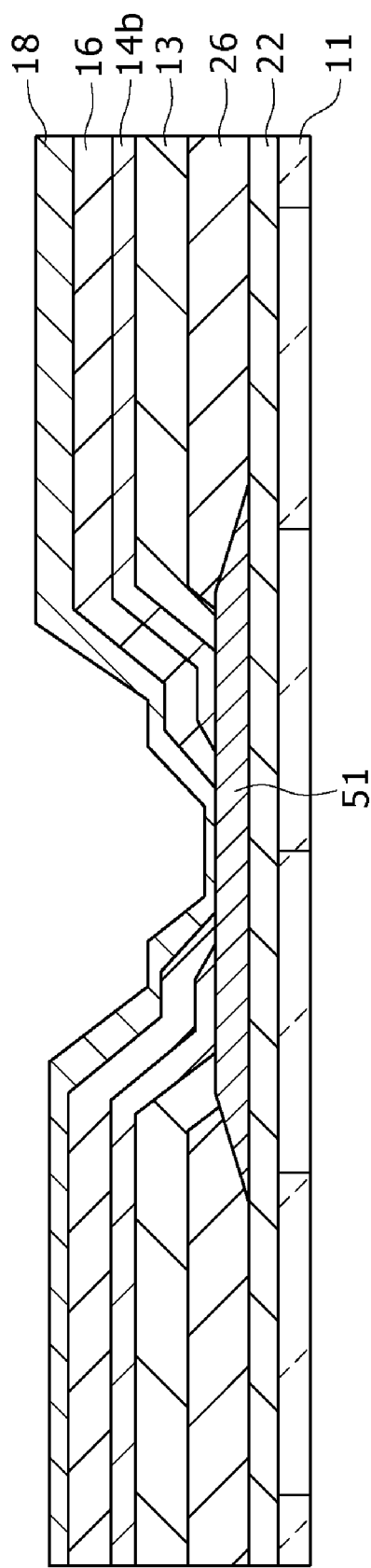
FIG. 19 is a sectional view showing the configuration example of the contact-disposed part.

FIG. 19 is a sectional view along line V-V'. As shown in FIG. 19, the gate insulating film 22 is stacked on the substrate 11, and the contact pad 51 in the same layer as that of the second metal layer 25 is formed on a partial area of the gate insulating film 22. The contact pad 51 is formed by using the same material as that of the second metal layer 25 with the same thickness as that of the second metal layer 25 for example. The formation area of the contact pad 51 corresponds to the area surrounded by the heavy line 85.

In the passivation film 26, an aperture through which part of the contact pad 51 is exposed is formed. The formation area of this aperture corresponds to the area surrounded by the line 82 in FIG. 18.

In the planarization insulating film 13, an aperture for connecting the auxiliary interconnect 14b formed on the planarization insulating film 13 to the contact pad 51 is formed. The formation area of this aperture corresponds to the area surrounded by the line 83 in FIG. 18. The auxiliary interconnect 14b is formed to the upper surface of the contact pad 51 along the inner wall surface of the aperture by this planarization insulating film 13.

The aperture-defining insulating film 16 is formed to the upper surface of the contact pad 51 along this auxiliary interconnect 14b. Thereby, the aperture-defining insulating film 16 forms an aperture for connecting the second electrode 18 formed on the aperture-defining insulating film 16 to the contact pad 51. The formation area of this aperture corresponds to the area surrounded by the line 84 in FIG. 18. The second electrode 18 is uniformly formed across the surface forming this aperture and the upper surface of the contact pad 51.

Due to this structure, in the contact-disposed part 50, the auxiliary interconnect 14b is electrically connected to the contact pad 51. The second electrode 18 is electrically connected to the contact pad 51. Furthermore, the auxiliary interconnect 14b is electrically connected to the second electrode 18 via the contact pad 51.

In the structure of this contact-disposed part 50, the auxiliary interconnect 14b and the aperture-defining insulating film 16 with a structure obtained by stacking them in that order are formed along the inner wall surface of the aperture by the planarization insulating film 13. That is, the inner wall surface of the aperture by the planarization insulating film 13 is covered by two layers of the auxiliary interconnect 14b and the aperture-defining insulating film. This can suppress the deterioration of the second electrode 18 and the organic layer 17 due to water included in the planarization insulating film 13 and degassing from the planarization insulating film 13.

Furthermore, in the case of the structure of this contact-disposed part 50, even when recess and projection are generated in the inner wall surface of the aperture by the planarization insulating film 13, the influence of the recess and projection is absent and the disconnection of the second electrode 18 can be suppressed because two layers of the auxiliary interconnect 14b and the aperture-defining insulating film 16 intervene between this inner wall surface and the second electrode 18.

Method for Manufacturing Display Device

A method for manufacturing the above-described display device will be described below. The display device according to the second embodiment is the same as the display device according to the first embodiment except for the difference in the configuration of the contact-disposed part 50. Therefore, in the following, the step of forming the contact-disposed part 50 will be mainly described and description of the other steps is omitted.

First, the gate electrode 23, the etching stopper 24, the semiconductor layer 38, and the second metal layer 25 are formed over the substrate 11 through repetition of film deposition by CVD and sputtering and pattern formation by photolithography. In the contact-disposed part 50, as shown in 20A, the contact pad 51 in the same layer as that of the second metal layer 25 is formed on the gate insulating film 22.

Figure 20A:
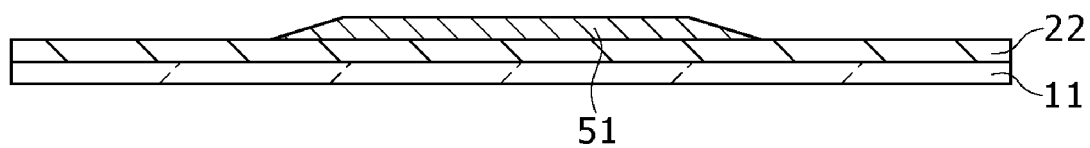
FIGS. 20A to 20C are sectional views for explaining a method for manufacturing the display device.
Figure 20B:
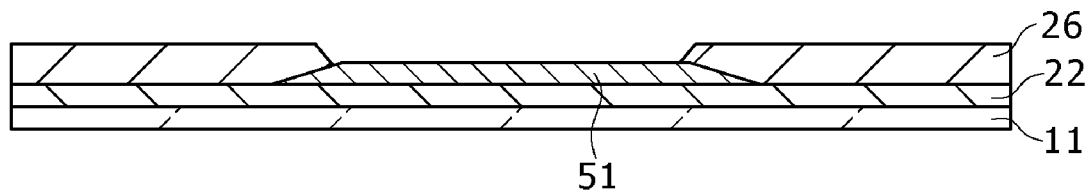

Next, the passivation film 26 covering the TFT 41 is formed by CVD. In the contact-disposed part 50, as shown in FIG. 20B, an aperture through which part of the upper surface of the contact pad 51 is exposed is formed by removing part of the passivation film 26 by photolithography.

Figure 20C:
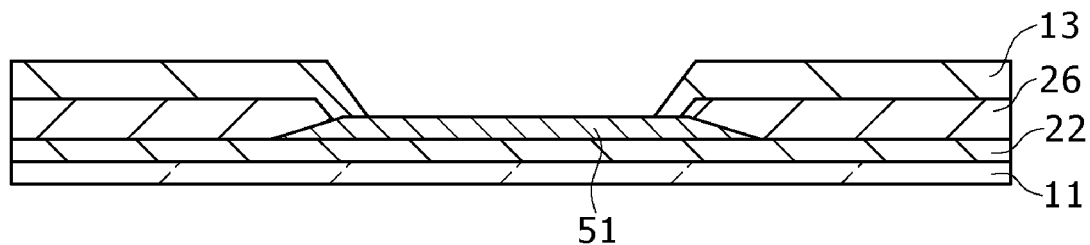

Next, a photosensitive resin to serve as the planarization insulating film 13 is applied on the passivation film 26 by spin-coating. In the contact-disposed part 50, as shown in FIG. 20C, an aperture is formed in the planarization insulating film 13 by photolithography so that the contact pad 51 may be exposed, and then baking is performed. Simultaneously, the part of the planarization insulating film 13 corresponding to the separator 91 is removed by photolithography, so that the separator 91 to divide the planarization insulating film 13 into the planarization insulating film 13 on the side of the display area P and the planarization insulating film 13 on the side of the peripheral area Q is formed (diagrammatic representation is omitted).

Figure 21A:
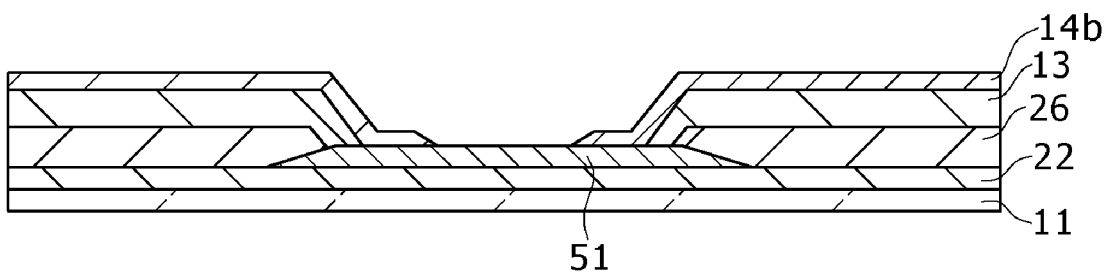
FIGS. 21A to 21C are sectional views for explaining the method for manufacturing the display device.

Next, the first electrode 14a and the auxiliary interconnect 14b are formed by sputtering and patterning into a predetermined shape by photolithography and etching. In the contact-disposed part 50, as shown in FIG. 21A, the auxiliary interconnect 14b is so patterned as to be formed to part of the upper surface of the contact pad 51 along the inner wall surface of the aperture by the planarization insulating film 13.

Figure 21B:
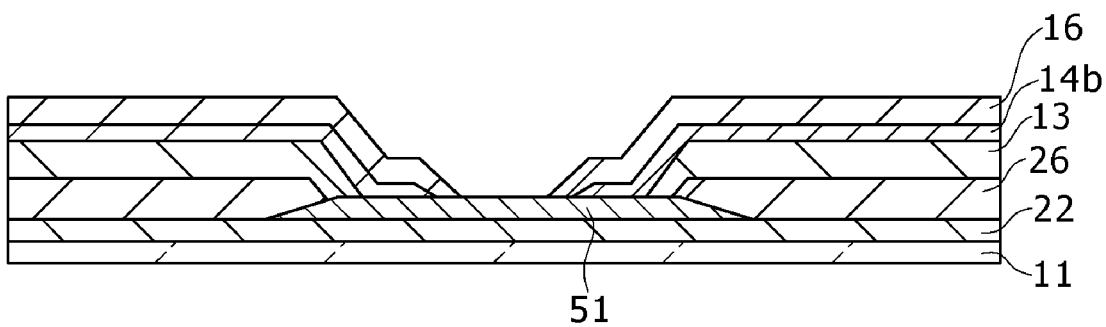

Next, a photosensitive resin to serve as the aperture-defining insulating film 16 is applied on the first electrode 14a and the auxiliary interconnect 14b by spin-coating. Thereafter, an aperture is formed at the position that matches the first electrode 14a by photolithography, and then baking is performed. In the contact-disposed part 50, as shown in FIG. 21B, the aperture-defining insulating film 16 is formed to part of the upper surface of the contact pad 51 along the auxiliary interconnect 14b by photolithography.

Figure 21C:
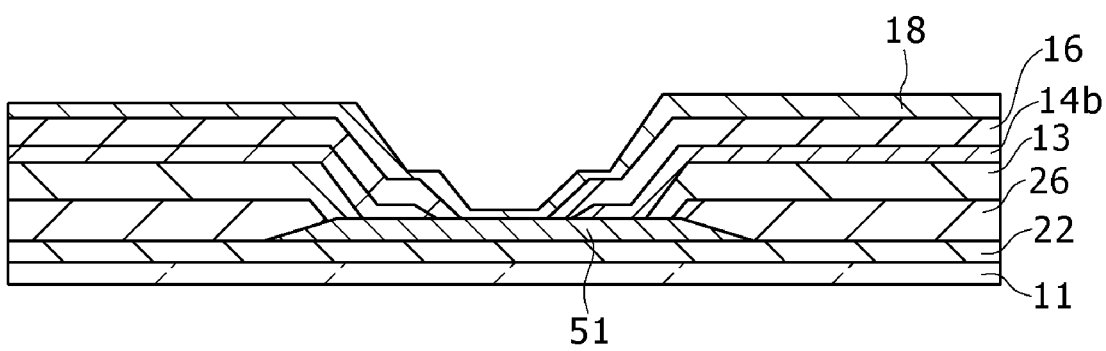

Next, the organic layer 17 is formed on the first electrode 14a exposed through the aperture of the aperture-defining insulating film 16 by vacuum evaporation. The organic layer 17 is formed by depositing a hole injection layer, a hole transport layer, a light emitting layer, and an electron transport layer in that order for example (diagrammatic representation is omitted). In this step, materials corresponding to the respective light emission colors are deposited for the light emitting layer. Furthermore, the second electrode 18 is uniformly formed on the organic layer 17 and the aperture-defining insulating film 16 by vacuum evaporation. In the contact-disposed part 50, as shown in FIG. 21C, the second electrode 18 is uniformly formed on the aperture-defining insulating film 16 and the upper surface of the contact pad.

Thereafter, the protective layer 19 is formed on the second electrode 18 by vacuum evaporation. Furthermore, an adhesive layer is formed by spin-coating of a UV-curable resin on the protective layer 19, and the sealing substrate 20 is bonded to the protective layer 19 with the intermediary of the adhesive layer. Through the above-described steps, the display device can be obtained.

Advantageous Effects

In the display device according to the second embodiment, in the contact-disposed part 50, the inner wall surface of the aperture by the planarization insulating film 13 is covered by two layers of the auxiliary interconnect 14b and the aperture-defining insulating film 16. This can suppress the deterioration of the organic layer 17 and the second electrode 18 due to water remaining in the planarization insulating film 13 and degassing from the planarization insulating film 13.

In the display device according to the second embodiment, in the contact-disposed part 50, two layers of the auxiliary interconnect 14b and the aperture-defining insulating film 16 intervene between the inner wall surface of the aperture by the planarization insulating film 13 and the second electrode 18. Therefore, it is possible to suppress the disconnection of the second electrode 18 due to the influence of recess and projection in the inner wall surface of the aperture by the planarization insulating film 13.

As another advantageous effect, the display device according to the second embodiment allows suppression of the deterioration of the organic material of the organic layer 17 and the transformation of the material of the second electrode 18 due to water remaining in the planarization insulating film 13 and degassing from the planarization insulating film 13, similarly to the first embodiment.

3. Third Embodiment

Configuration of Display Device

A display device according to a third embodiment will be described below. The display device according to the third embodiment is the same as the display device according to the first embodiment except for that the configuration of the contact-disposed part 50 is different. Therefore, in the following, the configuration of the contact-disposed part 50 will be described in detail, and description of other configurations is omitted.

Contact-Disposed Part

Figure 22:
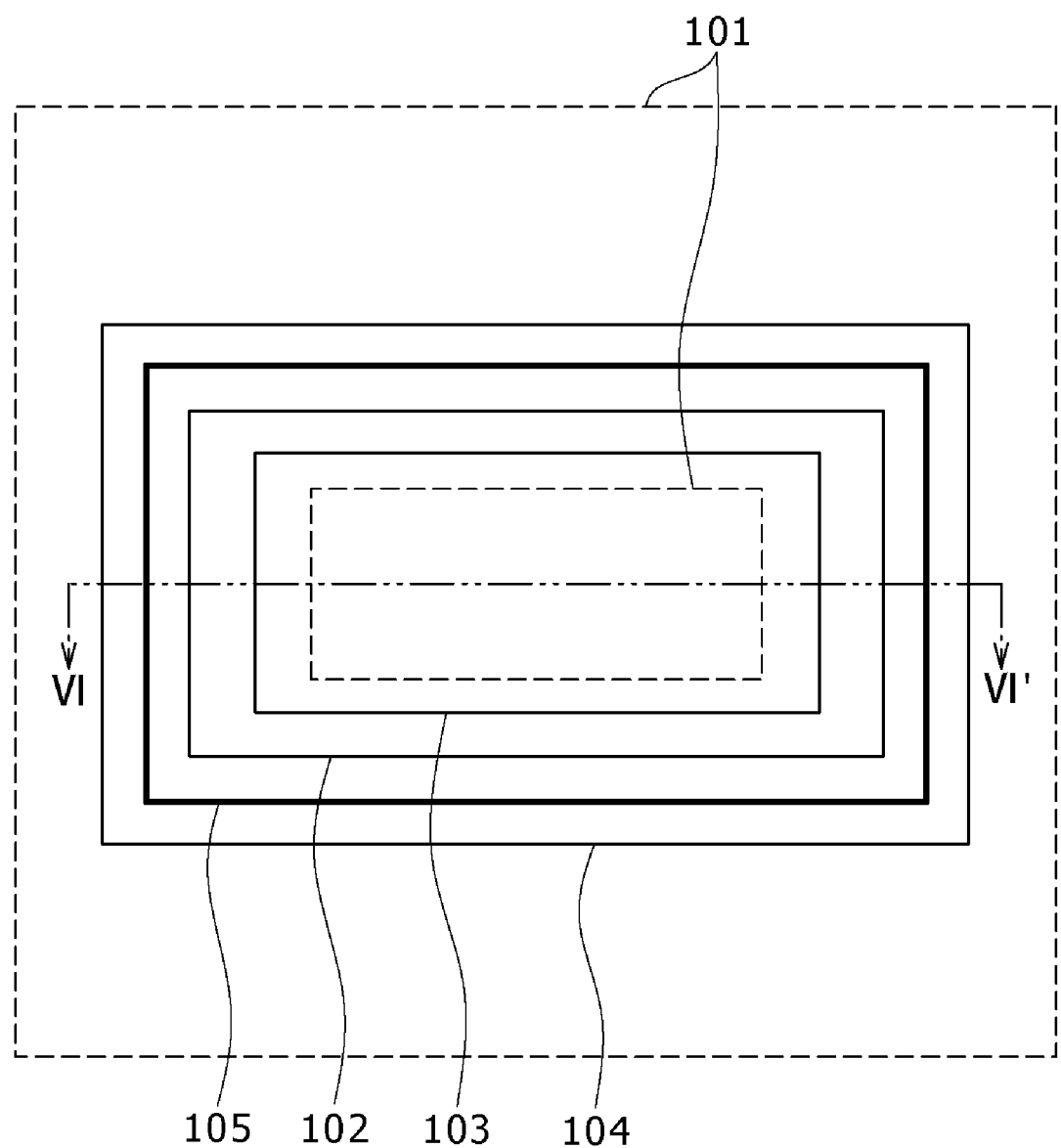
FIG. 22 is a plan view showing a configuration example of the contact-disposed part.

The contact-disposed part 50 will be described below. FIG. 22 is a plan view obtained when the contact-disposed part 50 is viewed from the upper surface side. In FIG. 22, the area surrounded by dotted lines 101 (area between the inner dotted line and the outer dotted line) indicates the area in which the auxiliary interconnect 14b is formed. The area surrounded by a line 102 indicates the removal part of the passivation film. The area surrounded by a line 103 indicates the removal part of the planarization insulating film 13. The area surrounded by a line 104 indicates the removal part of the aperture-defining insulating film 16. The area surrounded by a heavy line 105 indicates the area in which the contact pad 51 is formed.

Figure 23:
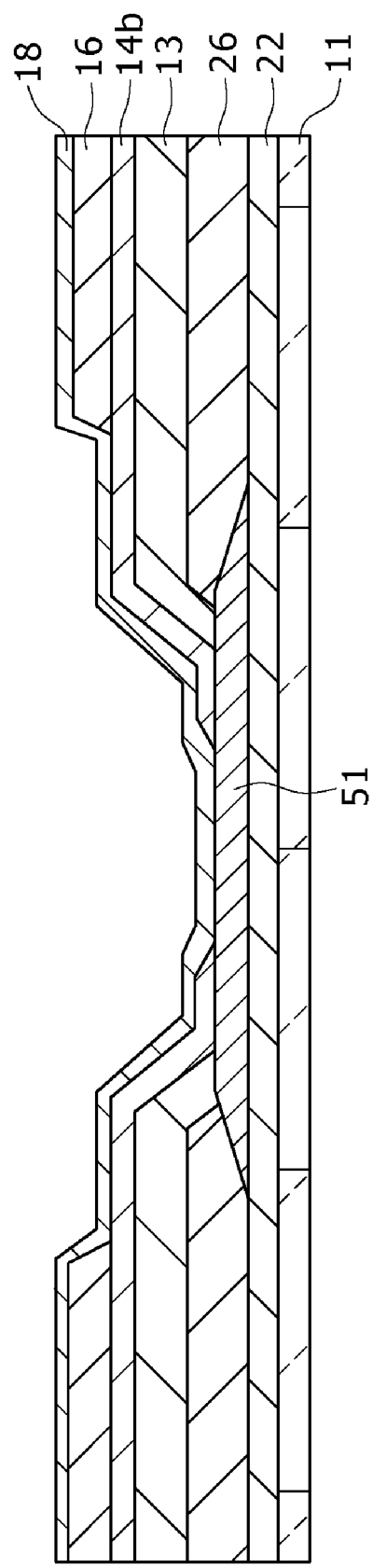
FIG. 23 is a sectional view showing the configuration example of the contact-disposed part.

FIG. 23 is a sectional view along line VI-VI'. As shown in FIG. 23, the gate insulating film 22 is stacked on the substrate 11, and the contact pad 51 in the same layer as that of the second metal layer 25 is formed on a partial area of the gate insulating film 22. The contact pad 51 is formed by using the same material as that of the second metal layer 25 with the same thickness as that of the second metal layer 25. The formation area of the contact pad corresponds to the area surrounded by the heavy line 105 in FIG. 22. In the passivation film 26, an aperture through which part of the contact pad 51 is exposed is formed. The formation area of this aperture corresponds to the area surrounded by the line 102 in FIG. 22.

In the planarization insulating film 13, an aperture for connecting the auxiliary interconnect 14b provided on the planarization insulating film 13 to the contact pad 51 disposed as a lower layer is formed. In the aperture-defining insulating film 16, an aperture for connecting the second electrode 18 provided on the aperture-defining insulating film 16 to the contact pad 51 disposed as a lower layer is formed. The size of the aperture by the aperture-defining insulating film 16 (equivalent to the area surrounded by the line 104 in FIG. 22) is set larger than the size of the aperture by the planarization insulating film 13 (equivalent to the area surrounded by the line 103 in FIG. 22). Thus, the flat surface of the planarization insulating film 13 partially has an exposed surface that is not covered by the aperture-defining insulating film 16. The auxiliary interconnect 14b is formed to part of the upper surface of the contact pad 51 along part of this exposed surface and the inner wall surface of the aperture by the planarization insulating film 13.

By the inner wall surface of the aperture by the aperture-defining insulating film 16 and the auxiliary interconnect 14b, an aperture for connecting the second electrode 18 provided over the planarization insulating film 13 to the contact pad 51 is formed. The second electrode 18 is uniformly formed across the surface forming this aperture and the upper surface of the contact pad 51.

Due to this structure, in the contact-disposed part 50, the auxiliary interconnect 14b is electrically connected to the contact pad 51. The auxiliary interconnect 14b is electrically connected to the second electrode 18. The second electrode 18 is electrically connected to the contact pad 51. Furthermore, the auxiliary interconnect 14b is electrically connected to the second electrode 18 via the contact pad 51.

In the structure of this contact-disposed part 50, the auxiliary interconnect 14b is formed on the inner wall surface of the aperture by the planarization insulating film 13 and the exposed surface of the flat surface of the planarization insulating film 13. That is, the inner wall surface of the aperture by the planarization insulating film 13 and the exposed surface of the flat surface of the planarization insulating film 13 are covered by the auxiliary interconnect 14b. This can suppress the deterioration of the second electrode 18 and the organic layer 17 due to water included in the planarization insulating film 13 and degassing from the planarization insulating film 13.

Furthermore, in the case of the structure of this contact-disposed part 50, even when recess and projection are generated in the inner wall surface of the aperture by the planarization insulating film 13, the influence of the recess and projection is absent and the disconnection of the second electrode 18 can be suppressed because the auxiliary interconnect 14b intervenes between this inner wall surface and the second electrode 18.

Method for Manufacturing Display Device

A method for manufacturing the above-described display device will be described below. The display device according to the third embodiment is the same as the display device according to the first embodiment except for the difference in the configuration of the contact-disposed part 50. Therefore, in the following, the step of forming the contact-disposed part 50 will be mainly described and description of the other steps is omitted.

First, the gate electrode 23, the etching stopper 24, the semiconductor layer 38, and the second metal layer 25 are formed over the substrate 11 through repetition of film deposition by CVD and sputtering and pattern formation by photolithography. In the contact-disposed part 50, as shown in 24A, the contact pad 51 in the same layer as that of the second metal layer 25 is formed on the gate insulating film 22.

Figure 24A:
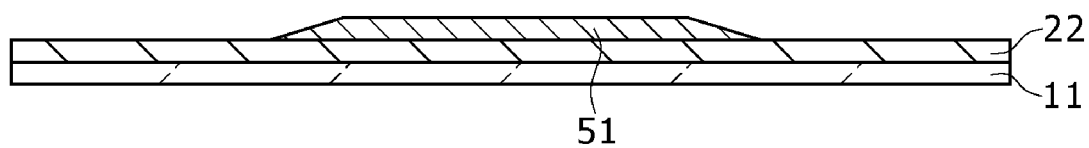
FIGS. 24A to 24C are sectional views for explaining a method for manufacturing the display device.
Figure 24B:
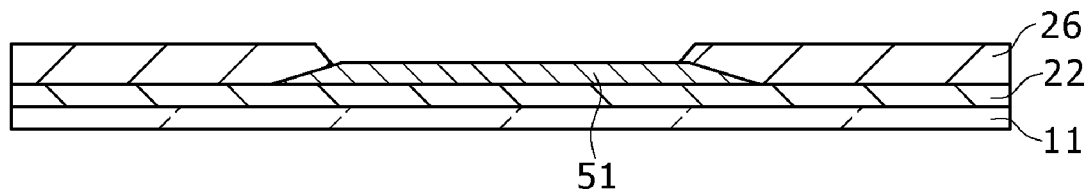

Next, the passivation film 26 covering the TFT 41 is formed by CVD. In the contact-disposed part 50, as shown in FIG. 24B, an aperture through which part of the upper surface of the contact pad 51 is exposed is formed by removing part of the passivation film 26 by photolithography.

Figure 24C:
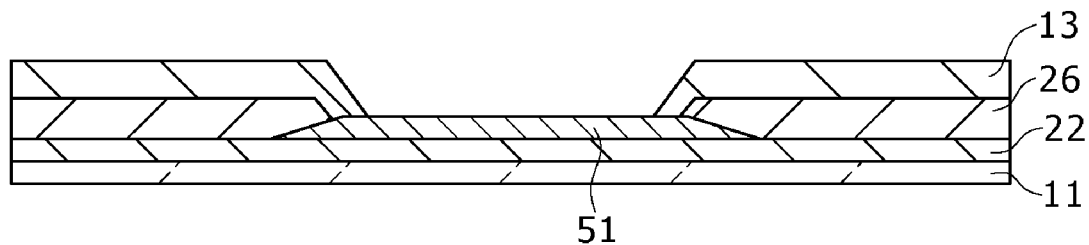

Next, a photosensitive resin to serve as the planarization insulating film 13 is applied on the passivation film 26 by spin-coating. In the contact-disposed part 50, as shown in FIG. 24C, an aperture is formed in the planarization insulating film 13 by photolithography so that the contact pad 51 may be exposed, and then baking is performed. Simultaneously, the part of the planarization insulating film 13 corresponding to the separator 91 is removed by photolithography, so that the separator 91 to divide the planarization insulating film 13 into the planarization insulating film 13 on the side of the display area P and the planarization insulating film 13 on the side of the peripheral area Q is formed (diagrammatic representation is omitted).

Figure 25A:
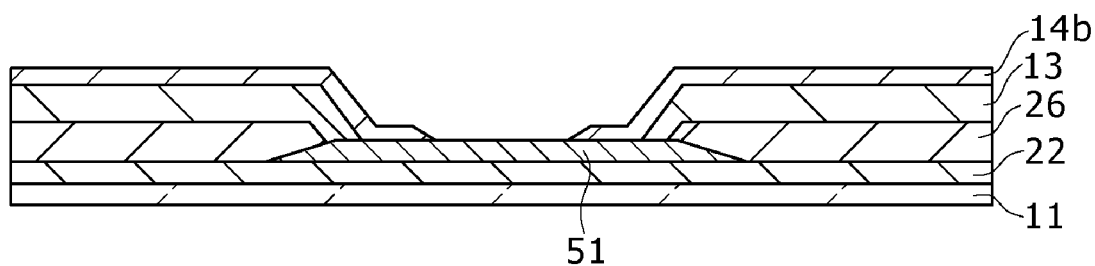
FIGS. 25A to 25C are sectional views for explaining the method for manufacturing the display device.

Next, the first electrode 14a and the auxiliary interconnect 14b are formed by sputtering and patterning into a predetermined shape by photolithography and etching. In the contact-disposed part 50, as shown in FIG. 25A, the auxiliary interconnect 14b is so patterned as to be formed to part of the upper surface of the contact pad 51 along the inner wall surface of the aperture by the planarization insulating film 13.

Figure 25B:
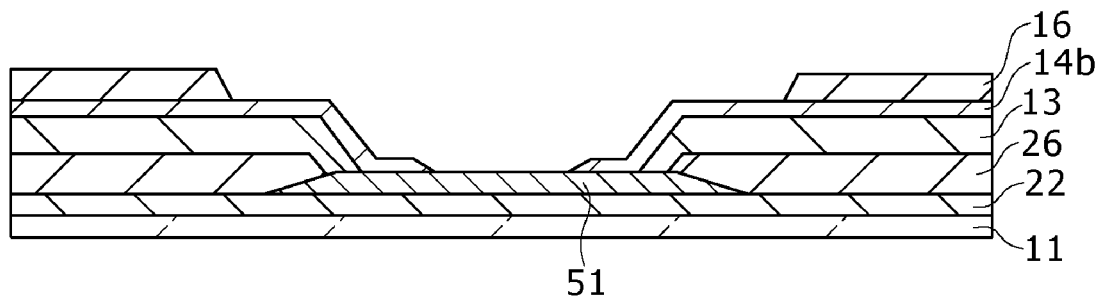

Next, a photosensitive resin to serve as the aperture-defining insulating film 16 is applied on the first electrode 14a and the auxiliary interconnect 14b by spin-coating. Thereafter, an aperture is formed at the position that matches the first electrode 14a by photolithography, and then baking is performed. In the contact-disposed part 50, as shown in FIG. 25B, a photosensitive resin to serve as the aperture-defining insulating film 16 is applied, and thereafter the aperture-defining insulating film 16 having an aperture whose size is larger than that of the aperture by the planarization insulating film 13 is formed by photolithography.

Figure 25C:
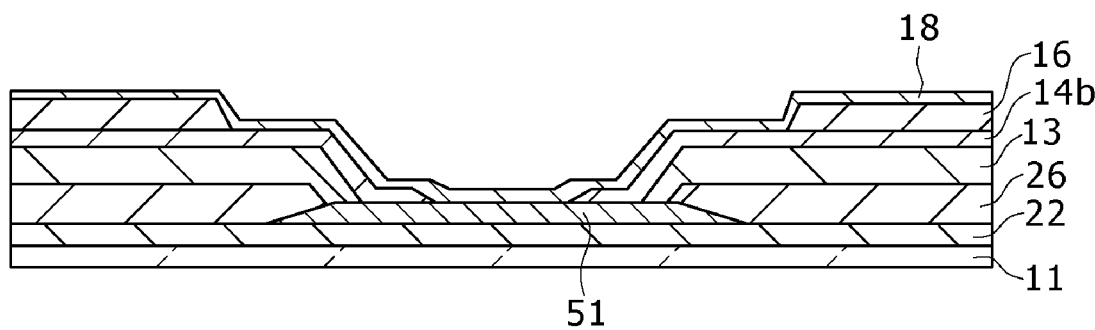

Next, the organic layer 17 is formed on the first electrode 14a exposed through the aperture of the aperture-defining insulating film 16 by vacuum evaporation. The organic layer 17 is formed by depositing a hole injection layer, a hole transport layer, a light emitting layer, and an electron transport layer in that order for example (diagrammatic representation is omitted). In this step, materials corresponding to the respective light emission colors are deposited for the light emitting layer. Furthermore, the second electrode 18 is uniformly formed on the organic layer 17 and the aperture-defining insulating film 16 by vacuum evaporation. In the contact-disposed part 50, as shown in FIG. 25C, the second electrode 18 is uniformly formed on the aperture-defining insulating film 16, the auxiliary interconnect 14b, and the upper surface of the contact pad 51.

Thereafter, the protective layer 19 is formed on the second electrode 18 by vacuum evaporation. Furthermore, an adhesive layer is formed by spin-coating of a UV-curable resin on the protective layer 19, and the sealing substrate 20 is bonded to the protective layer 19 with the intermediary of the adhesive layer. Through the above-described steps, the display device can be obtained.

Advantageous Effects

In the display device according to the third embodiment, in the contact-disposed part 50, the inner wall surface of the aperture by the planarization insulating film 13 is covered by the auxiliary interconnect 14b. This can suppress the deterioration of the organic layer 17 and the second electrode 18 due to water remaining in the planarization insulating film 13 and degassing from the planarization insulating film 13.

In the display device according to the third embodiment, in the contact-disposed part 50, the auxiliary interconnect 14b intervenes between the inner wall surface of the aperture by the planarization insulating film 13 and the second electrode 18. Therefore, it is possible to suppress the disconnection of the second electrode 18 due to the influence of recess and projection in the inner wall surface of the aperture by the planarization insulating film 13.

As another advantageous effect, the display device according to the third embodiment allows suppression of the deterioration of the organic material of the organic layer 17 and the transformation of the material of the second electrode 18 due to water remaining in the planarization insulating film 13 and degassing from the planarization insulating film 13, similarly to the first embodiment.

4. Fourth Embodiment

A display device according to a fourth embodiment will be described below. The display device according to the fourth embodiment is the same as the display device according to the first embodiment except for the configuration of the separator 91. Therefore, in the following, the configuration of the separator 91 will be described, and description of other configurations is omitted.

Configuration of Separator

Figure 26:
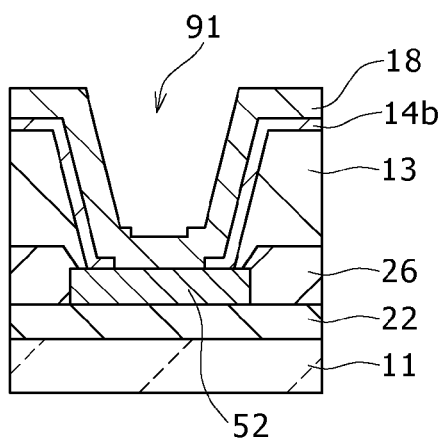
FIG. 26 is a sectional view for explaining a configuration example of the separator.

The configuration of the separator 91 will be described in detail below. FIG. 26 is an enlarged sectional view showing the configuration of the separator 91. In the separator 91, the contact part 52 in the same layer as that of the second metal layer 25 has an exposed surface that is not covered by the planarization insulating film 13 and the passivation film 26. The auxiliary interconnect 14b is formed across part of the exposed surface of this contact part and the surface of the planarization insulating film along which the separator 91 is formed. Furthermore, the second electrode 18 is formed on the exposed surface of the contact part 52 on which the auxiliary interconnect 14b is not formed and the auxiliary interconnect 14b. Thereby, the second electrode 18 is electrically connected to the auxiliary interconnect 14b via the contact part 52, which allows favorable connection (preferably, ohmic connection) with the second electrode 18.

Advantageous Effects

The display device according to the fourth embodiment has the same advantageous effects as those by the first embodiment.

Working Examples

By tests to be described below, studies were made about the coverage of the aperture-defining insulating film 16 in the peripheral area T inside the separator 91. This embodiment is not limited to the organic EL panels fabricated in the following test examples.

Test Example 1

Initially, an organic EL panel having the configuration shown in FIG. 1 was fabricated. First, the TFT 41 was formed over a glass substrate through repetition of film deposition by CVD and sputtering and pattern formation by photolithography. Next, the passivation film 26 was so formed as to cover this TFT 41.

Next, on the passivation film 26, the planarization insulating film 13 was formed by applying polyimide as a photosensitive resin by spin-coating. Furthermore, the part of the planarization insulating film 13 corresponding to the separator 91 was removed by photolithography, and thereby the separator 91 to divide the planarization insulating film 13 into the planarization insulating film 13 on the side of the display area P and the planarization insulating film 13 on the side of the peripheral area Q was formed. Next, an AlNd film as the material of the first electrode 14a (anode electrode) and the auxiliary interconnect 14b was formed on the planarization insulating film 13 by sputtering, and thereafter the first electrode 14a and the auxiliary interconnect 14b were patterned into a predetermined shape by photolithography and etching.

Next, a photosensitive resin (polyimide) to serve as the aperture-defining insulating film 16 was applied on the first electrode 14a and the planarization insulating film 13 by spin-coating. Thereafter, an aperture that matches the position of the first electrode 14a was formed by photolithography. At that time, in the peripheral area T, which was inside the separator 91 and outside the display area P, the aperture-defining insulating film 16 was so provided that the ratio of the covering area of the aperture-defining insulating film 16 to the area of this peripheral area T (the coverage of the aperture-defining insulating film, defined by the above-described (Expression 1)) was 60%.

Next, the organic layers 17 composed of the following materials corresponding to the respective light emission colors of R, G, and B were sequentially pattern-formed on the first electrode 14a exposed through this aperture by using vacuum evaporation.

[Organic Layer 17 (R Light Emission)]

hole injection layer 4,4,4"-tris(3-methylphenylamino) triphenylamine (m-MTDATA), film thickness 150 nm hole transport layer bis[(N-naphthyl)-N-phenyl]aminostyryl]benzidine (α-NPD), film thickness 150 nm light emitting layer 8-quinolinol aluminum complex (Alq3) [doped with 40% by volume of 2,6-bis[4-[N-(4-methoxyphenyl)-N-phenyl]aminostyryl]naphthalene-1,5-dicarbonitrile (BSN—BCN)], film thickness 55 nm electron transport layer 8-quinolinol aluminum complex (Alq3), film thickness 150 nm

[Organic Layer 17 (G Light Emission)]

hole injection layer 4,4,4"-tris(3-methylphenylamino) triphenylamine (m-MTDATA), film thickness 150 nm hole transport layer bis[(N-naphthyl)-N-phenyl]aminostyryl]benzidine (α-NPD), film thickness 150 nm light emitting layer 8-quinolinol aluminum complex (Alq3) [doped with 40% by volume of coumarin 6], film thickness 55 nm electron transport layer 8-quinolinol aluminum complex (Alq3), film thickness 150 nm

[Organic Layer 17 (B Light Emission)]

hole injection layer 4,4,4"-tris(3-methylphenylamino) triphenylamine (m-MTDATA), film thickness 150 nm hole transport layer bis[(N-naphthyl)-N-phenyl]aminostyryl]benzidine (α-NPD), film thickness 150 nm light emitting layer spiro 6Φ, film thickness 150 nm electron transport layer 8-quinolinol aluminum complex ($Alq_3$), film thickness 150 nm Next, the second electrode 18 (cathode electrode) composed of Mg and Ag was uniformly formed on the organic layer 17 and the aperture-defining insulating film 16 by vacuum evaporation. Thereafter, an $SiO_2$ film as the protective layer 19 was so formed by vacuum evaporation as to cover the whole of the organic layer 17 and the second electrode. Through the above-described steps, the organic EL panel was fabricated.

High-Temperature Storage Test

The fabricated organic EL panel was kept in a thermostatic chamber under a dry atmosphere at 70° C. for 1000 hours. Thereafter, the organic EL panel was driven and the luminance was measured. Furthermore, the occurrence of failure was determined based on the following criterion.

The criterion for the determination of the occurrence of failure: the efficiency equal to or lower than 80% of the initial efficiency was regarded as failure.

This determination was made about one sample of the organic EL panel, and {(the number of samples with the occurrence of failure)/(one sample)}×100% was calculated as the failure occurrence rate.

Test Example 2

Organic EL panels were fabricated in the same manner as that of test example 1 except for that the coverage of the aperture-defining insulating film was set to 40%, and the same high-temperature storage test was performed for three samples.

Test Example 3

Organic EL panels were fabricated in the same manner as that of test example 1 except for that the coverage of the aperture-defining insulating film was set to 30%, and the same high-temperature storage test was performed for three samples.

Test Example 4

Organic EL panels were fabricated in the same manner as that of test example 1 except for that the coverage of the aperture-defining insulating film was set to 25%, and the same high-temperature storage test was performed for four samples.

Test Example 5

Organic EL panels were fabricated in the same manner as that of test example 1 except for that the coverage of the aperture-defining insulating film was set to 20%, and the same high-temperature storage test was performed for three samples.

Test Example 6

Organic EL panels were fabricated in the same manner as that of test example 1 except for that the coverage of the aperture-defining insulating film was set to 10%, and the same high-temperature storage test was performed for two samples.

Figure 27:
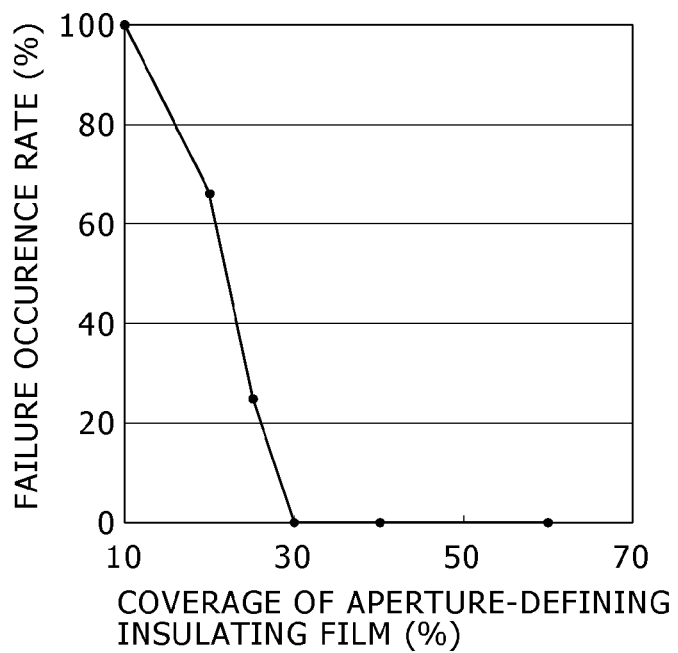
FIG. 27 is a graph obtained by summarizing the results of test examples.
Figure 28:
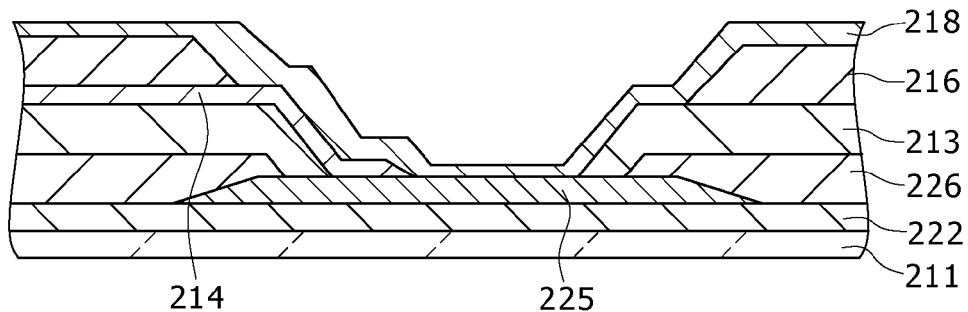
FIG. 28 is a sectional view showing a configuration example of the contact-disposed part of a related art.

FIG. 27 shows a graph obtained by summarizing the test results of test examples 1 to 6. As shown in FIG. 27, 30% or higher of the coverage of the aperture-defining insulating film resulted in 0% of the failure occurrence rate. In contrast, the coverage of the aperture-defining insulating film lower than 30% resulted in the occurrence of failure. As the coverage decreased from 30%, the failure occurrence rate rapidly increased.

5. Other Embodiments

Modification Examples

Although the specific description has been made above about the embodiments of this application, this invention is not limited to the above-described embodiments but various kinds of modifications based on the technical idea of this invention can be made.

For example, the numerical values, the structures, the shapes, the materials, etc. employed in the above-described embodiments are merely examples, and numerical values, structures, shapes, materials, etc. different from them may be used according to need.

It is also possible to form a display device by combining the first to fourth embodiments according to need. For example, a display device including both the contact-disposed part 50 with the configuration of the first embodiment and that with the configuration of the second embodiment may be formed.

For example, in the first to fourth embodiments, the organic layer 17 is formed of a stacking structure of hole injection layer/hole transport layer/light emitting layer/electron transport layer. However, the configuration of the organic layer 17 is not limited thereto. For example, the number of kinds of layers forming the organic layer and the number of layers may be arbitrarily increased or decreased according to need.

Furthermore, for example, the TFT 41 is formed by using the μc-Si film 36 and the n+-Si film 37 in the first to fourth embodiments. However, the TFT 41 may be formed by using a Poly-Si film.

In addition, for example, the respective layers forming the organic layer 17 are formed by film deposition methods such as vacuum evaporation in the first to fourth embodiments. However, the method for forming the layers is not limited thereto. For example, the respective layers forming the organic layer may be formed by a printing method and a transfer method.

For example, in the first to fourth embodiments, in order to suppress the deterioration of the organic EL element, the organic EL element is sealed by forming the protective film after forming the second electrode and bonding the sealing substrate such as glass to the protective film. However, the method for sealing the organic EL element is not limited thereto. For example, the organic EL element may be sealed by forming the protective film by vacuum evaporation and filling the space between the protective film and glass or the like with nitrogen in the bonding of the sealing substrate.

In the first to fourth embodiments, the auxiliary interconnect 14b and the second electrode 18 are disposed in the separator 91. However, the configuration of the separator 91 is not limited thereto. Specifically, for example, the first electrode 14a and the aperture-defining insulating film 16 may be disposed in the separator 91. Furthermore, the second electrode 18 may be disposed in the separator 91 based on another configuration as long as the surface of the planarization insulating film 13 along which the separator 91 is formed is not in direct contact with the second electrode 18. It is also possible to dispose the organic layer 17 in the separator 91 as long as the surface of the planarization insulating film 13 along which the separator 91 is formed is not in contact with the organic layer 17. However, it is better not to dispose the organic layer 17 in the separator 91.

For example, it is also possible to employ a system in which the organic EL element 21 is formed as an organic EL element that emits while light and a color filter is formed on the light-extraction side to thereby extract light of R, G, and B from white light.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A display device, comprising:
   a substrate;
   a circuit part configured to include a drive element formed over the substrate;
   a planarization insulating layer configured to be formed on the circuit part;
   an electrically-conductive layer configured to be formed on the planarization insulating layer and include a plurality of first electrodes and an auxiliary interconnect;
   an aperture-defining insulating layer configured to insulate the plurality of first electrodes from each other and have an aperture through which part of the first electrode is exposed;
   a plurality of light emitting elements configured to be formed by stacking the first electrode, an organic layer including a light emitting layer, and a second electrode common to the plurality of light emitting elements in that order over an exposed part of each of the plurality of first electrodes; and
   a separator configured to be formed by removing the planarization insulating layer at a position surrounding a display area in which the plurality of light emitting elements connected to the drive element are disposed, wherein
   in a whole area inside the separator, at least any of the electrically-conductive layer and the aperture-defining insulating layer intervenes between the planarization insulating layer and the second electrode and between the planarization insulating layer and the organic layer.

2. The display device according to claim 1, further comprising
   a contact part configured to be formed of the same layer as a metal layer included in the drive element and electrically interconnect the auxiliary interconnect and the second electrode, wherein
   in the planarization insulating layer, an aperture for leading the auxiliary interconnect formed on the planarization insulating layer to a lower layer is formed above the contact part, and an inner wall surface of the aperture by the planarization insulating layer is covered by at least any of the auxiliary interconnect and the aperture-defining insulating layer.

3. The display device according to claim 1, wherein an inner wall surface of an aperture by the planarization insulating layer is covered by the aperture-defining insulating layer.

4. The display device according to claim 1, wherein in an area that is inside the separator and is outside the display area, the aperture-defining insulating layer is so formed that coverage of the aperture-defining insulating layer, defined by an expression shown below, is a value in a range from 30% to 100%

(the coverage of the aperture-defining insulating layer)
={(covering area of the aperture-defining insulating layer)/(area of the area that is inside the separator and is outside the display area)}×100%     (Expression).

* * * * *